United States Patent [19]

Isshiki et al.

[11] Patent Number: 5,537,344

[45] Date of Patent: Jul. 16, 1996

[54] HIGH-SPEED PROCESSING APPARATUS AND METHOD, SIGNAL ANALYZING SYSTEM, AND MEASUREMENT APPARATUS AND METHOD

[75] Inventors: Nobuyuki Isshiki, Inba-gun; Kimie Sannomiya, Tokyo; Takanobu Uchida, Sohka; Toshiharu Numata, Tokyo, all of Japan

[73] Assignee: Kao Corporation, Tokyo, Japan

[21] Appl. No.: 356,250

[22] PCT Filed: Jun. 29, 1993

[86] PCT No.: PCT/JP93/00889

§ 371 Date: Dec. 22, 1994

§ 102(e) Date: Dec. 22, 1994

[87] PCT Pub. No.: WO94/00821

PCT Pub. Date: Jan. 6, 1994

[30] Foreign Application Priority Data

Jun. 30, 1992 [JP] Japan .................................. 4-195922

[51] Int. Cl.$^6$ ........................... G06F 17/10; G06F 17/14; G06F 17/15

[52] U.S. Cl. ................ 364/725; 364/724.01; 364/728.01

[58] Field of Search .......................... 764/724.01, 724.1, 764/724.12, 724.16, 725, 728.01

[56] References Cited

U.S. PATENT DOCUMENTS

4,974,187 11/1990 Lawton ............................... 364/728.01
5,253,530 10/1993 Letcher, III ............................ 73/602

FOREIGN PATENT DOCUMENTS

2643986A1 9/1990 France.

OTHER PUBLICATIONS

Vetterli et al., "Wavelets and Filter Banks: Theory and Design", IEEE Transactions on Signal Processing, vol. 40, No. 9, Sep. 1992, pp. 2207–2232.

Rioul et al., "Fast Algorithms for Discrete and Continuous Wavelet Transforms", IEEE Transactions on Information Theory, vol. 38, No. 2, Mar. 1992, pp. 569–586.

Kikuchi et al., "Fast Wavelet Transform and its Applicaton to Detecting Detonation", IEICE Transactions on Fundamentals of Electronics, Communications and Comp. Sci., vol. E75-a, No. 8, Aug. 1992, pp. 980–987.

M. J. Shensa, "Discrete Wavelet Transforms: The Relationship of the a Trous and Mallat Algorithms", Trezieme Colloque Sur Le Traitement Di Signal et des Images, 16 Sep. 1991, pp. 189–192.

Flandrin et al., "Generalized Target Description and Wavelet Decomposition", IEEE Transactions on Acoustics, Speech, and Signal Processing, vol. 38, No. 2, Feb. 1990, pp. 350–352.

Kenny et al., "Application of Time–Frequency Distributions to Radar Imaging", Proceedings of the 1990 IEEE International Symposium of Circuits and Systems, vol. 1/4, May 1990, pp. 231–233.

*Primary Examiner*—Roy N. Envall, Jr.
*Assistant Examiner*—Chuong D. Ngo
*Attorney, Agent, or Firm*—Fish & Richardson

[57] ABSTRACT

A convolution of input data $S_0$ and a Gabor function $G_{\alpha,\omega}$ is implemented by a processing unit (20) to obtain a wavelet coefficient $T_g(2^0, b)$ of a 0th stage. The input data $S_0$ is applied to a low-pass filter (30) and is subjected to Gaussian-type filtering so as to be converted into input data $S_1$ for a 1st stage. The frequency of the high-frequency components of this input data is halved by this filtering. A convolution of this input data $S_1$ and a Gabor function $G_\alpha/3, 2\omega/3$ is implemented by a processing unit (21) to obtain a wavelet coefficient $T_g(2^1, b)$ of the 1st stage. In the convolution of the 1st stage, the sampling interval is twice that of the 0th stage. Thenceforth, and in similar fashion, the sampling interval in processing operations of subsequent stages is doubled from one stage to the next. As a result, there is no increase in the amount of processing in each stage and a coefficient $T_g(2^j, b)$ can be obtained with identical precision in each stage.

16 Claims, 19 Drawing Sheets

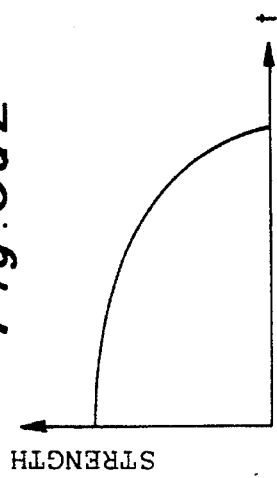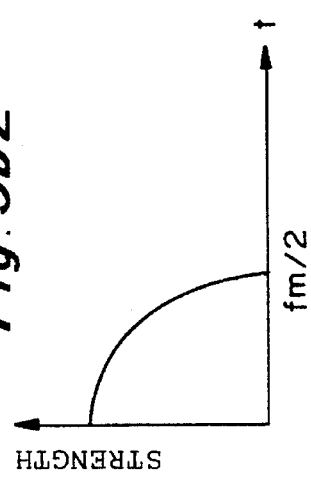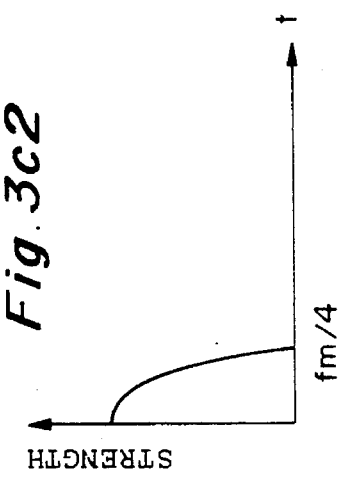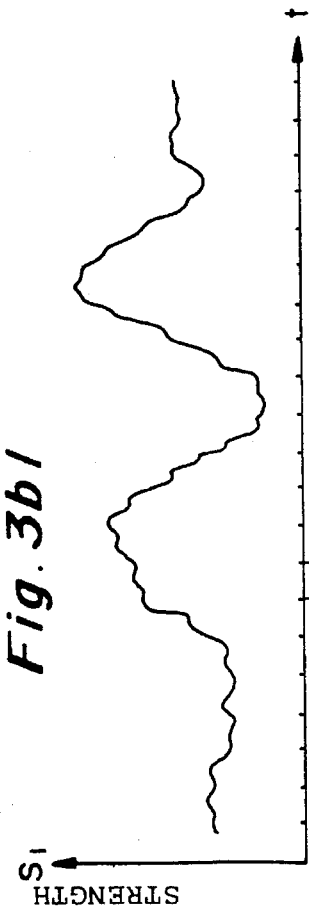

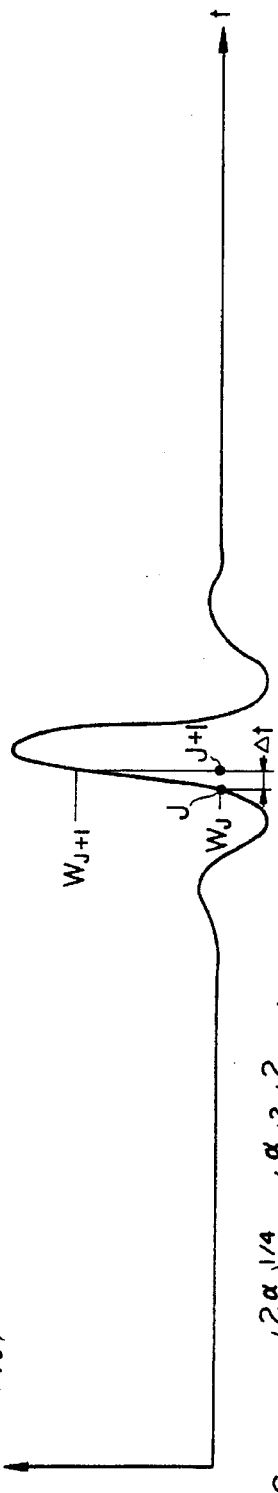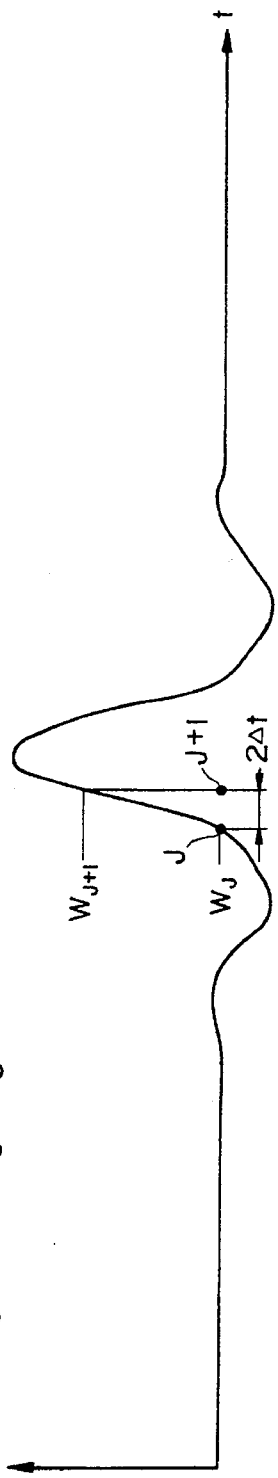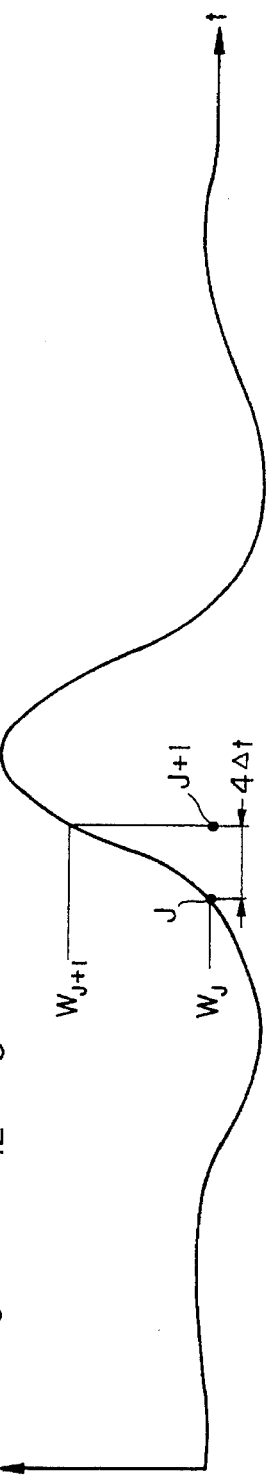

HIGH-SPEED PROCESSING APPARATUS AND METHOD, SIGNAL ANALYZING SYSTEM, AND MEASUREMENT APPARATUS AND METHOD

TECHNICAL FIELD

This invention relates to an apparatus and method for high-speed processing, a signal analyzing system, and a measurement apparatus and method. More particularly, the invention relates to an apparatus and method that utilize a wavelet transform.

BACKGROUND ART

The application of the wavelet transform to speech recognition, image processing, turbulence theory, non-linear, non-equilibrium physics, chaos and fractals has become extensive in recent years.

Wavelet analysis is signal processing that is used when it is desired to know not only the frequency contained in data but also time or position information. Wavelet analysis involves selecting, as a base function, a function localized about a certain time (space) and not a function spread uniformly in time (space), as in the manner of a trigonometric function used in Fourier analysis, and performing analysis of a signal by a parallel translation and similar transformation. By virtue of such analysis, it becomes possible to specify not only frequency but also the position of an event.

Further, since the signal is decomposed by a similar transformation, which is dilation and contraction of the base, the nature of wavelet analysis is such that time-wise resolution rises with respect to sudden changes (high frequencies) while frequency resolution rises with respect to gradual changes (low frequencies).

A wavelet transform $T_g(a,b)$ of an input signal $S(t)$ in which $G(t)$ represents the base function is defined as follows:

$$T_g(a, b) = \frac{1}{\sqrt{a}} \int S(t) G^* \left( \frac{t-b}{a} \right) dt \quad (1)$$

where * denotes the complex conjugate and $T_g(a,b)$ is referred to as a wavelet coefficient. Further, a represents a scale parameter [the range of dilation of the base function $G(t)$] and b represents shift (the position of the base function in space or time). Equation (1) is the convolution of the base function $G(t)$ and input signal $S(t)$.

By taking the discrete versions of the base function and input signal and representing these by $G[(n-b)/a]$ and $S(n)$ ($n=1, 2, \ldots$), respectively, we may express Equation (1) as follows:

$$T_g(a, b) = \frac{1}{\sqrt{a}} \sum_n S(n) G^* \left( \frac{n-b}{a} \right) \quad (2)$$

FIGS. 24a and 24b illustrate the distinction between a wavelet transform and a Fourier transform.

FIG. 24a shows the wavelet transform. Here the input signal S(t) is decomposed into signals $G_{\alpha 0,\omega 0}(t)$, $G_{\alpha 1,\omega 1}(t)$ localized about a certain time (space). Here $2\omega_0=\omega_1$ holds. The function $G_{\alpha,\omega}(t)$ shown in FIG. 24a is the Gabor function, which is used generally as the base function, and is expressed by the following equation:

$$G(t) = G_{\alpha,\omega}(t) \equiv \left( \frac{2\alpha}{\pi} \right)^{1/4} \exp(-\alpha t^2 + i\omega t) \quad (3)$$

FIG. 24b shows the Fourier transform. Here the input signal S(t) is decomposed into sine waves $E_1 \sin(w_{f0}t+\psi_1)$, $E_2 \sin(w_{f1}t+\psi_2)$ dilated uniformly in time (space).

The Fourier transform generally has come to be applied widely owing to the development of an outstanding high-speed algorithm referred to as an "FFT" (Fast-Fourier Transform).

An algorithm for implementing high-speed processing in highly precise fashion has not yet been developed for the wavelet transform.

The problem is that when the wavelet coefficient is obtained in accordance with Equation (2), the support of the base function G used takes on a large size at low frequencies. As a consequence, the number of samplings increases even if the sampling interval is the same.

It has been proposed to reduce the number of samples by performing linear interpolation with regard to the base function when a wavelet coefficient of low frequency is obtained. Consider a situation in which the j-th wavelet coefficient is obtained. Assume that the base function is composed of N-number of sampling points $G_i$ ($i=1, 2, \ldots N$) in the case of the (j−1)th base function. The j-th base function is constructed from these points by performing linear interpolation. There are instances in which incorrect results are obtained by adopting this method of interpolation.

DISCLOSURE OF THE INVENTION

An object of the present invention is to provide a high-speed processing apparatus and method for the wavelet transform in which highly precise analytical results can be obtained at high speed.

Another object of the invention is to provide a signal analyzing system that utilizes the high-speed processing apparatus described above.

A further object of the invention is to provide a measuring apparatus and method that utilize the high-speed processing apparatus and method described above.

A high-speed processing apparatus according to a first feature of the present invention comprises processing circuit means in a plurality of stages.

The processing circuit means of each stage comprises a plurality of cascade-connected shift register means for storing input data and successively shifting the input data in response to applied clock pulses, a plurality of first storage circuit means for storing function values sampled at a prescribed sampling period with regard to a base function having such a property that a convolution of identical functions becomes the same as the original function, a plurality of second storage circuit means for storing function values, sampled at the prescribed sampling period, with regard to a low-pass filter function for converting a frequency of a frequency component possessed by the input data into input data, for the next stage, having a frequency component whose frequency is 1/M of the frequency of the first-mentioned input data, where M represents a positive integer excluding the integer 1, a plurality of first multiplying circuit means each for multiplying input data or output data of the shift register means by corresponding function value stored in the first storage circuit means, first adding circuit means for adding together output data from these first multiplying circuit means, a plurality of second multiplying circuit means each for multiplying input data or output data of the shift register means by corresponding function value stored in the second storage circuit means, and second adding circuit means for adding together output data from these second multiplying circuit means.

Multiplication and addition in the processing circuit means of each stage are performed during one period of the clock pulses. The shift register means in the processing circuit means of a succeeding stage are provided in a number which is M times that of the shift register means in the processing circuit means for a preceding stage, and data having a sampling period which is M times that of the input data or output data of these shift register means is applied to the first and second multiplying circuit means. Output data from the second adding circuit means is applied as input data to the processing circuit means of the next stage.

The result of the processing operations is obtained from the first adding circuit means.

A high-speed processing apparatus according to a second feature of the present invention comprises processing circuit means for performing a repetitive convolution processing operation over a plurality of stages, memory means for storing, stage by stage, input data applied to the processing circuit means, and control circuit means for controlling writing of data to and reading of data from the memory means as well as repetition of the processing operation performed by the processing circuit means.

The processing circuit means comprises a plurality of first storage circuit means for storing function values sampled at a prescribed sampling period with regard to a base function having such a property that a convolution of identical functions becomes the same as the original function, a plurality of second storage circuit means for storing function values sampled at the prescribed sampling period with regard to a low-pass filter function for converting a frequency of a frequency component possessed by the input data into input data, for the next stage, having a frequency component whose frequency is 1/M of the frequency of the first-mentioned input data, where M represents a positive integer excluding the integer 1, and, in the processing operation of each stage, a plurality of first multiplying circuit means for multiplying input data of this stage stored in the memory means by corresponding function values stored in the first storage circuit means and first adding circuit means for adding together output data from these first multiplying circuit means, and further, in the processing operation of each stage, a plurality of second multiplying circuit means for multiplying input data of this stage stored in the memory means by corresponding function values stored in the second storage circuit means and second adding circuit means for adding together output data from these second multiplying circuit means.

The number of items of input data of each stage stored in the memory means is M times the number of items of input data of the preceding stage, and when input data for a processing operation of a succeeding stage is obtained from the second adding circuit means in the processing operation of each stage, this obtained input data is stored in the memory means as input data of the succeeding stage and the input data of the succeeding stage that has been stored in the memory means is successively shifted.

The control circuit means reads the input data for the processing operation of each stage out of the memory means at a fixed period in such a manner that a readout sampling period of the input data of the succeeding stage becomes M times the readout sampling period of the preceding stage and applies this input data to the processing circuit means, and applies data obtained from the second adding circuit means of the processing circuit means to the memory means as the input data of the succeeding stage.

The result of the processing operations is obtained from the first adding circuit means.

A high-speed processing apparatus according to a third feature of the present invention comprises processing circuit means for repeatedly performing a convolution operation, memory means for storing input data for a processing operation of a succeeding stage to be applied to this processing circuit means, and control circuit means for controlling writing of data to and reading of data from the memory means as well as repetition of the processing operation performed by the processing circuit means.

The processing circuit means comprises a plurality of first storage circuit means for storing function values sampled at a prescribed sampling period with regard to a base function having such a property that a convolution of identical functions becomes the same as the original function, a plurality of second storage circuit means for storing function values sampled at the prescribed sampling period with regard to a low-pass filter function for converting a frequency of a frequency component possessed by the input data into input data for the next stage having a frequency component whose frequency is 1/M of the frequency of the first-mentioned input data, where M represents a positive integer excluding the integer 1, and, in the processing operation of each stage, a plurality of first multiplying circuit means for multiplying input data read out of the memory means by corresponding function values stored in the first storage circuit means and first adding circuit means for adding together output data from these first multiplying circuit means, and further, in the processing operation of each stage, a plurality of second multiplying circuit means for multiplying input data read out of the memory means by corresponding function values stored in the second storage circuit means and second adding circuit means for adding together output data from these second multiplying circuit means.

The control means performs an operation of reading input data for a processing operation of an initial stage, in which the number of items of input data is equal to the number of function values stored in the first and second storage means, out of the memory means and applying this input data to the processing circuit means, this operation being performed repeatedly with regard to all input data for the processing operation of the initial stage while successively shifting the input data to be applied, and successively stores, in the memory means, input data for the next stage obtained from the second adding circuit means for every processing operation in the processing circuit means.

Further, in processing operations following the processing operation of the initial stage, the control circuit means reads, in every stage, input data, the number of items of which is equal to the number of function values, out of the memory means and applies this input data to the processing circuit means, while successively shifting the input data to be read out, at a readout sampling period which is M times the readout sampling period of the input data from the memory means in the processing operation of the preceding stage, and successively stores the input data for the next stage obtained from the second adding circuit means in the memory means for every processing operation in the processing circuit means, and, in a processing operation of a final stage, performs solely an operation of reading the input data out of the memory means and applying this input data to the processing circuit means.

The result of the processing operations is obtained from the first adding circuit means.

A high-speed processing apparatus according to a fourth feature of the present invention comprises processing circuit means of a plurality of stages for executing a convolution of input data and function data of a base function having such a property that a convolution of identical functions becomes the same as the original function, and low-pass filtering circuit means of a number of stages one less than that of the processing circuit means for converting a frequency component possessed by the input data of a preceding stage into input data, for the next stage, having a frequency component which is 1/M of the first-mentioned frequency component, where M represents a positive integer excluding the integer 1.

Function data extended over a range M times that of function data set in the processing circuit means of a preceding stage is set in the processing circuit means of each stage.

The processing circuit means and low-pass filtering circuit means of each stage respectively execute convolution and low-pass filtering operations at a sampling period whose period is M times that of the sampling period in the processing circuit means and low-pass filtering circuit means of the preceding stage. The input data for the processing circuit means of an initial stage is applied to the low-pass filtering circuit means of the initial stage and the input data obtained from each low-pass filtering circuit means is applied to the processing circuit means of the next stage and the low-pass filtering circuit means of the next stage.

The result of the processing operations can be obtained from the processing circuit means of the plurality of stages.

A high-speed processing method according to a fifth feature of the present invention uses processing circuit means of a plurality of stages for executing a convolution between input data and function data of a base function having such a property that a convolution of identical functions becomes the same as the original function, and low-pass filtering circuit means of a number of stages one less than that of the processing circuit means for converting a frequency component possessed by the input data of a preceding stage into input data for the next stage having a frequency component which is 1/M of the first-mentioned frequency component, where M represents a positive integer excluding the integer 1.

Function data extended over a range twice that of the function data stored in the processing circuit means of a preceding stage is set in the processing circuit means of each stage. The processing circuit means and low-pass filtering circuit means of each stage are made to respectively execute convolution and low-pass filtering operations at a sampling period whose period is M times that of the sampling period in the processing circuit means and low-pass filtering circuit means of the preceding stage. The input data for the processing circuit means of the initial stage is applied to the low-pass filtering circuit means of the initial stage and the input data obtained from each low-pass filtering circuit means is applied to the processing circuit means of the next stage and the Low-pass filtering circuit means of the next stage.

The results of the processing operations can be obtained from the processing circuit means.

A high-speed processing method according to a sixth feature of the present invention uses processing means, which has been set beforehand to function data of a base function having such a property that a convolution of identical functions becomes the same as the original function, for executing a convolution of input data and this function data, low-pass filtering means for converting a frequency component possessed by the input data into input data, for the next stage, having a frequency component which is 1/M of the first-mentioned frequency component, where M represents a positive integer excluding the integer 1, and storage means for storing, stage by stage, the input data to be used by the processing means.

Input data is stored in the storage means in such a manner that the number of items of data of each stage becomes M times the number of items of input data of the preceding stage, and when the input data for the initial stage has been applied, and when the input data for the next stage has been obtained from the low-pass sampling means in the processing operation of each stage, the items of input data are stored in the storage means as input data of the corresponding stage, and the input data of the corresponding stage stored in the storage means is successively shifted.

When the input data for the initial stage has been applied, the input data for the initial stage is read out of the storage means and applied to the processing means and the low-pass filtering means, the data obtained from the processing means is adopted as output data of the initial stage and the data obtained from the low-pass filtering means is stored in the storage means as the input data for the next stage, and in the stages from the next stage onward, the input data for the processing operation of each stage is read out of the storage means and applied to the processing means and low-pass filtering means at a fixed period in such a manner that the readout sampling period of the input data of the succeeding stage becomes M times the readout sampling period of the preceding stage, the data obtained from the processing means is adopted the output data of each stage and the data obtained from the low-pass filtering means is applied to the storage means as input data of the next stage.

The above-described operation is repeated over a prescribed number of stages, and the low-pass filtering means is disabled in a final stage. Whenever the repetition of the above-described operation over the prescribed number of stages ends, input data for the initial stage is accepted and the above-described repetitive operation is started again.

A high-speed processing method according to a seventh feature of the present invention uses processing means, which has been set beforehand to function data of a base function having such a property that a convolution of identical functions becomes the same as the original function, for executing a convolution of input data and this function data, low-pass filtering means for converting a frequency component possessed by the input data into input data, for the next stage, having a frequency component which is 1/M of the first-mentioned frequency component, where M represents a positive integer excluding the integer 1, and storage means for storing the input data to be used by the processing means.

An operation of reading input data for a processing operation of an initial stage, in which the number of items of input data is equal to the number of items of function data set in the processing means, out of the storage means and applying this input data to the processing circuit means and the low-pass filtering means is repeatedly performed with regard to all input data for the processing operation of the initial stage while successively shifting the input data to be applied, the data obtained from the processing means is adopted as output data of the initial stage, and the input data for the next stage obtained from the low-pass filtering means is successively stored in the storage means.

In processing operations following the processing operation of the initial stage, input data, the number of items of which is equal to the number of items of function data, is successively read out of the storage means and applied to the processing means and the low-pass filtering means stage by stage, while the input data to be read out is successively shifted, at a readout sampling period which is M times the readout sampling period of the input data from the storage means, the data obtained from the processing means is adopted as the output data of each stage, and the input data for the next stage obtained from each low-pass filtering means is successively stored in the storage means.

The above-described operation is performed over a prescribed plurality of stages. In a processing operation of a final stage, solely an operation of reading the input data out of the memory means and applying this input data to the processing means is performed.

In accordance with the present invention, the base function for the wavelet transform employed is a base function having such a property that the convolution of identical functions becomes the same as the original function. When such a function is used, the convolution that obtains the input data for the next stage becomes equivalent to low-pass filtering, and the frequency of the high-frequency component of the input data for the processing operation of the next stage becomes 1/M of that of the preceding stage. Accordingly, the sampling interval of the input data can be made M times larger. Though the area of integration of the base function also is widened M times when the next stage is attained, the sampling interval also becomes M times larger and, hence, the number of samplings is the same.

Thus, according to the present invention, a convolution using the same number of data is possible in any stage, and it is unnecessary to increase the number of data for a processing operation. With the present invention, therefore, the desired precision can be maintained in the processing operation of any stage. Moreover, since there is no increase in the number of data, processing operations can be performed at high speed.

The present invention further provides a signal analyzing system using the high-speed processing apparatus described above.

The signal analyzing system of the present invention comprises an input circuit for converting a given physical signal into an electric input signal, an A/D converting circuit for converting an input signal outputted by the input circuit into digital input data, and an analytical processing apparatus for analyzing the digital input data outputted by the A/D converting circuit. The analytical processing apparatus is implemented by the high-speed processing apparatus described above.

Accordingly, when the signal analyzing system according to the invention is used, various signals possessing a physical form such as externally applied ultrasonic waves, electromagnetic waves or seismic waves can be analyzed at high speed and in highly precise fashion.

In a preferred embodiment of a signal analyzing system according to the present invention, the system is further provided with a storage device for storing the input data obtained from the A/D converting circuit and data indicative of analytical results obtained from the processing means. Accordingly, once the input data has been stored in the storage device, the input data can be read out and used in signal analysis. Further, the results of signal analysis also can be stored temporarily in the storage device and then read out and used in post-processing and display, described later.

In another embodiment of the present invention, the signal analyzing system is further provided with a post-processor for converting the data indicative of the analytical results obtained from the processing means into data suitable for display.

This makes it possible to display analytical data in an easily readable and understandable manner.

The signal analyzing system preferably is further provided with an output unit for outputting, as visible information, the data indicative of the analytical results obtained from the processing means, the data indicative of the analytical results stored in the storage device or post-processed data obtained from the post-processor.

The present invention further provides a measuring apparatus and a measuring method.

A measuring apparatus according to the present invention comprises transmitting means for transmitting a physical signal toward an object, receiving means for receiving the physical signal that returns upon being reflected from the object and converting the physical signal into an electric input signal, an A/D converting circuit for converting the input signal outputted by the receiving means into digital input data, and an analytical processing unit for analyzing the digital input data outputted by the A/D converting circuit. The analytical processing unit is implemented by the high-speed processing apparatus described above.

A measuring method according to the present invention involves transmitting a physical signal toward an object, receiving the physical signal that returns upon being reflected from the object, converting the signal into an electric input signal, converting the converted electric input signal into digital input data, and subjecting the converted input data to wavelet analysis. The wavelet analysis is executed by the high-speed processing apparatus described above.

In accordance with the present invention, a signal having a physical form such as an ultrasonic wave, electromagnetic wave or seismic wave is transmitted toward an object, the wave reflected from the object is received and then an input signal based upon the received wave is subjected to wavelet analysis. This makes it possible to detect the position and behavior of the object unerringly and at high speed and precision.

BRIEF DESCRIPTION OF THE DRAWINGS

FIGS. 3a1, 3b1 and 3c1 are waveform diagrams illustrating input signals of a 0th stage, 1st stage and 2nd stage, respectively, and FIGS. 3a2, 3b2 and 3c2 are graphs illustrating frequency spectrums of respective ones of these inputs signals;

FIGS. 4a, 4b and 4c are waveform diagrams illustrating Gabor functions used in a 0th stage, 1st stage and 2nd stage, respectively;

BEST MODE FOR CARRYING OUT THE INVENTION (1) Overall Configuration of Signal Analyzing System FIG. 1 illustrates an overview of the overall configuration of a signal analyzing system.

Figure 1:
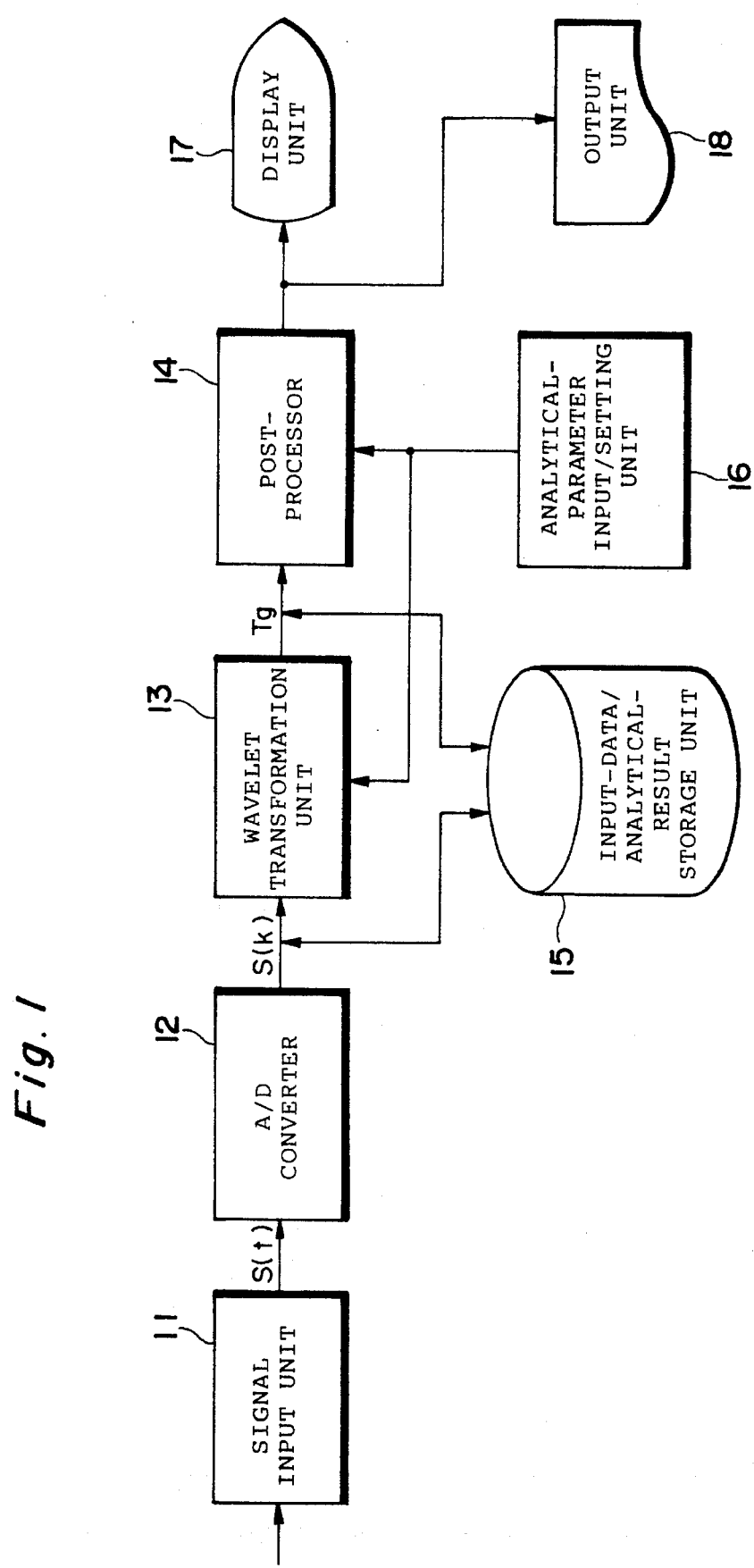
FIG. 1 is a block diagram showing the overall configuration of a signal analyzing system.

A signal input unit 11 takes on a variety of forms depending upon the application of the signal analyzing system. In a case where non-destructive inspection, fish finding or measurement of blood flow, which is described below, is performed using ultrasonic waves, the signal input unit 11 would be an ultrasonic receiver that receives the reflected ultrasonic waves from the object. In a detection system utilizing electromagnetic waves such as radar, the signal input unit 11 would be realized in the form of a receiver of reflected electromagnetic waves. In a case where the system is applied to identification of internal structure underground or the discovery of petroleum deposits based upon the transmission of artificial seismic waves into the earth and analysis of reflected waves from the earth's crust, a seismograph would be used as the signal input unit. In applications to speech analysis and speech recognition, a transducer for converting sound to an electric signal, such as a microphone, would correspond to the signal input unit 11. Furthermore, in applications to analysis of electrocardiogram waveforms and examination of brain waves, the signal input unit 11 would be realized as an electrocardiograph or electroencephalograph.

In any case, the signal input unit 11 converts externally provided physical signals in a variety of forms into electric signals and outputs the electric signals. An analog output signal S(t) from the signal input unit 11 is converted into digital data S(k) (where k is the sample number) in an analog/digital converter (A/D converter) 12 at an appropriate sampling period that is capable of preserving the characteristic features of the input signal S(t), and the digital data is applied to a wavelet transformation unit 13 or input-data/analytical-result storage unit 15.

The input data S(k) is applied to the wavelet transformation unit 13 from the A/D converter 12 directly or upon being stored temporarily in the storage unit 15 and then read out of the storage unit. The wavelet transformation unit 13 executes wavelet transformation of the input data S(k) applied thereto and outputs a wavelet coefficient $T_g$ obtained by the transformation. The input data S(k) and the wavelet coefficient $T_g$ obtained from the transformation unit 13 are stored in the input-data/analytical-result storage unit 15 as necessary. The storage unit 15 is implemented by a well-known semiconductor memory, magnetic memory or the like. The details of the wavelet transformation unit 13 will be described later.

The wavelet coefficient $T_g$ obtained from the wavelet transformation unit 13 is applied to a post-processor 14 directly or upon being stored temporarily in the storage unit 15 and then read out of the storage unit. The post-processor 14 uses the wavelet coefficient $T_g$ to create data representing a frequency cross section, time cross section, a threshold-value cross section, time integral, etc. These items of post-processed data are displayed on a display unit 17 or outputted as visible information from an output unit 18 such as a printer. It may be arranged so that the results of post-processing also are stored in the storage unit 15. Analytical parameters (e.g., parameters $\alpha$, $\omega$ related to the Gabor function, parameters a, b of the wavelet transform, etc.) used in the wavelet transform or in post-processing are entered or set from an analytical-parameter input/setting unit 16.

(2) Basic Concept of a Wavelet Transform

As set forth above, the wavelet transform is represented by Equation (1) or Equation (2), and the wavelet coefficient $T_g(a,b)$ is obtained by the convolution of the base function g(t) and input signal S(t).

Assume that a function having such a property that a convolution of identical functions becomes the same as the original function is used as the base function of the wavelet transform. This property is expressed by the following equation:

$$[g*g](\tau) = \int g(t) g(t-\tau) dt = c \cdot g(\tau) \quad (4)$$

where c denotes a constant.

In the description that follows, the symbols of the convolution represented by the left side of Equation (4) will be used as much as possible in order to simplify representation.

The Gabor function expressed by Equation (3) described above is one example of a base function possessing the property represented by Equation (4).

When the Gabor function is used as the base function, the wavelet coefficient $T_g(a, b)$ represented by Equation (1) is expressed by the following equation:

$$T_g(a, b) = \frac{1}{\sqrt{a}} \int S(t) G^*_{\alpha,\omega}\left(\frac{t-b}{a}\right) dt = \frac{1}{\sqrt{a}} \int S(t) \cdot \quad (5)$$

$$\left(\frac{2\alpha}{\pi}\right)^{1/4} \exp\left\{-\alpha\left(\frac{t-b}{a}\right)^2 - i\omega\left(\frac{t-b}{a}\right)\right\} dt =$$

$$\int S(t) \cdot \left(\frac{2}{\pi} \cdot \frac{\alpha}{a^2}\right)^{1/4} \exp\left\{-\frac{\alpha}{a^2}(t-b)^2 - i\frac{\omega}{a}(t-b)\right\} dt =$$

$$\int S(t) G^*_{\alpha/a^2, \omega/a}(t-b) dt = [S*G_{\alpha/a^2, \omega/a}](b)$$

Here, utilizing the property expressed by Equation (4), namely that the convolution of Gabor functions becomes the Gabor function, and expanding Equation (5) by writing $$a = 2^j \quad (j=0, 1, 2, \ldots) \tag{6}$$

we obtain the following results:

for $j = 0$:

$$T_g(2^0, b) = A_0[S*G_{\alpha,\omega}](b) \tag{7}$$

$$A_0 = 1 \tag{8}$$

for $j = 1$:

$$T_g(2^1, b) = A_1[B_0[S*G_{\alpha,0}]*G_{\alpha/3, 2\omega/3}](b) \tag{9}$$
$$= A_1[S_1*G_{\alpha/3, 2\omega/3}](b)$$

$$S_1 = B_0[S*G_{\alpha,0}] \tag{10}$$

$$A_1 = \frac{1}{\left(\frac{3\pi}{2\alpha}\right)^{1/4} \exp\left(-\frac{\omega^2}{12\alpha}\right)}$$

$$B_0 = 1 \tag{12}$$

for $j = 2$:

$$T_g(2^2, b) = A_2[B_1[B_0[S*G_{\alpha,0}]*G_{\alpha/3,0}]*G_{\alpha/12,\omega/3}](b) \tag{13}$$
$$= A_2[S_2*G_{\alpha/12,\omega/3}]$$

$$S_2 = B_1[B_0[S*G_{\alpha,0}]*G_{\alpha/3,0}] \tag{14}$$
$$= B_1[S_1*G_{\alpha/3,0}]$$

$$A_2 = \frac{1}{\sqrt{2}\left(\frac{6\pi}{\alpha}\right)^{1/4} \exp\left(-\frac{\omega^2}{12\alpha}\right)} \tag{14}$$

$$B_1 = \frac{1}{\left(\frac{3\pi}{2\alpha}\right)^{1/4}} \tag{15}$$

for $j = 3$:

$$T_g(2^3, b) = A_3[B_2[B_1[S*G_{\alpha,0}]*G_{\alpha/3,0}]*G_{\alpha/12,0}]*G_{\alpha/48,\omega/6}](b) \tag{17}$$
$$= A_3[S_3*G_{\alpha/48,\omega/6}]$$

$$S_3 = B_2[B_1[B_0[S*G_{\alpha,0}]*G_{\alpha/3,0}]*G_{\alpha/12,0}] \tag{18}$$
$$= B_2[S_2*G_{\alpha/12,0}]$$

$$A_3 = \frac{1}{2\sqrt{2}\left(\frac{24\pi}{\alpha}\right)^{1/4} \exp\left(-\frac{12\omega^2}{\alpha}\right)} \tag{19}$$

$$B_2 = \frac{1}{\left(\frac{6\pi}{\alpha}\right)^{1/4}} \tag{20}$$

Expressing this by general formulae for $j \geq 1$, we have:

$$T_g(\alpha, b) = \frac{1}{\text{Coeff}} \times [S*D_j*G_{\alpha/3 \cdot 2^{2(j-1)}, \omega/3 \cdot 2^{j-2}}](b) \tag{21}$$

$$D_j \equiv \left[G_{\alpha,0} * \prod_{k=1}^{j-1} *G_{\alpha/3 \cdot 2^{2(k-1)}, 0}\right] \tag{22}$$
$$= [G_{\alpha/3 \cdot 2^{2(j-2)}, 0}*D_{j-1}]$$

$$\prod_{k=1}^{j} *h_k \equiv \begin{cases} [h_1*h_2*\ldots*h_k*\ldots*h_j] & (j \geq 1) \\ 1 & (j = 0) \end{cases} \tag{23}$$

$$\text{Coeff} = \begin{cases} \left[\prod_{i=1}^{j-1} C_{\alpha/2^{2(i-1)}, 0, \alpha/(2^{2(i-1)} \cdot 3), 0}\right] \cdot \\ C_{\alpha/2^{2(j-1)}, 0, \alpha/(3 \cdot 2^{2(j-1)}), \omega/(3 \cdot 2^{j-2})} \cdot \\ \frac{2^{j-1}}{\sqrt{2}} & (j \geq 2) \\ C_{\alpha, 0, \alpha/3, 2\omega/3} & (j = 1) \end{cases} \tag{24}$$

$$C_{\alpha, k, \beta, m} \equiv \left(\frac{2\pi}{\alpha + \beta}\right)^{1/4} \exp\left\{-\frac{(k-m)^2}{4(\alpha+\beta)}\right\} \tag{25}$$

Figure 2:
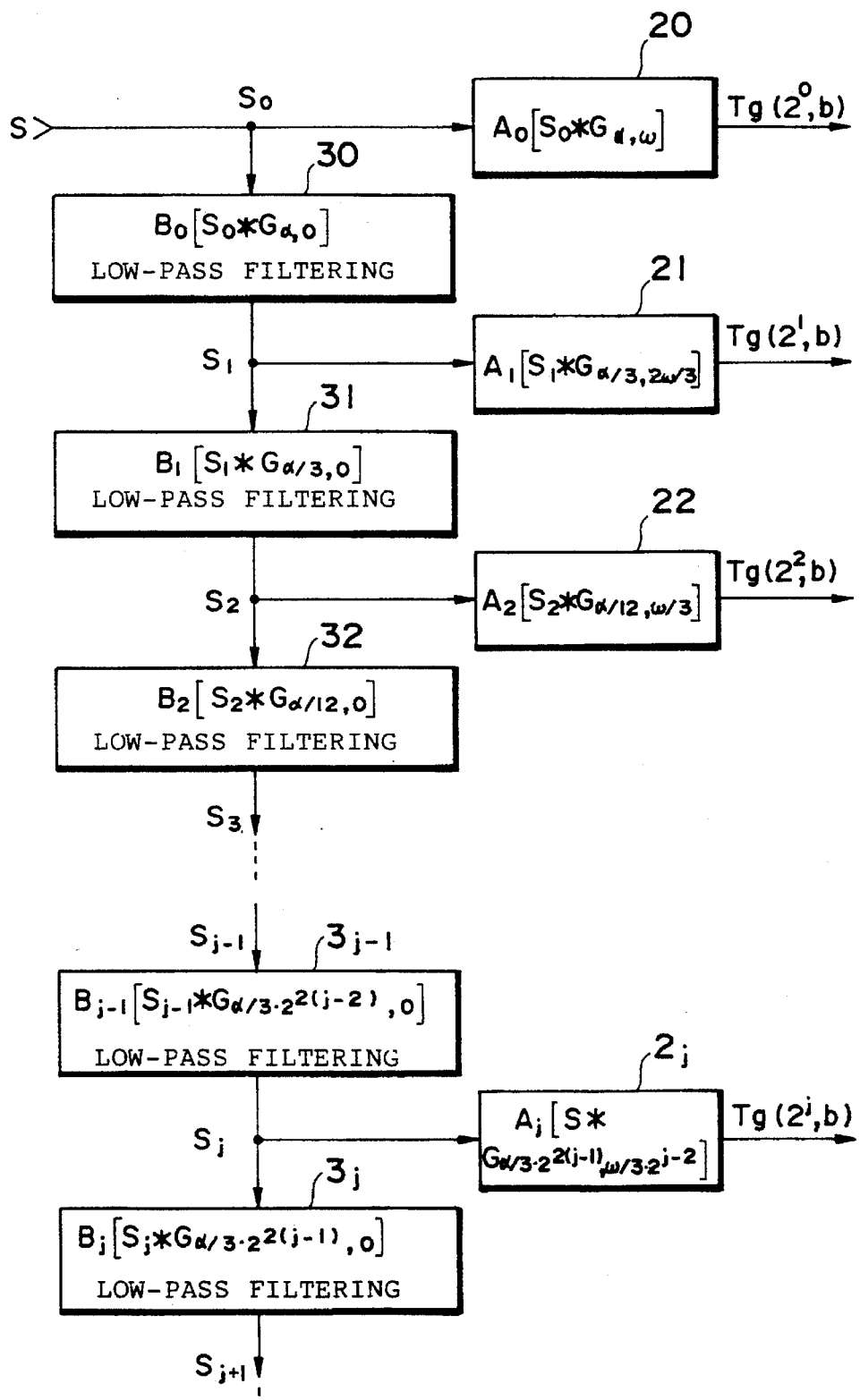
FIG. 2 is a functional block diagram showing the basic concept of a wavelet transform.

FIG. 2 is a functional block diagram for executing the processing operations represented by the above-mentioned Equations (7) through (25). We substitute $S_0$ for the input signal S.

In a processing unit 20 of a 0th stage, the convolution represented by Equation (7) regarding an input signal $S_0$ is executed to obtain a wavelet coefficient $T_g(2^0, b)$.

Similarly, in a processing unit 30 of the 0th stage, the convolution represented by Equation (10) regarding the input signal $S_0$ is executed to obtain an input signal $S_1$ of a 1st stage.

The input signal $S_1$ is used in the 1st stage. That is, the convolution represented by Equation (9) is performed by a processing unit 21 to obtain a wavelet coefficient $T_g(2^1, b)$ and the convolution represented by Equation (14) is performed by a processing unit 31 to obtain an input signal $S_2$ of a 2nd stage.

Similarly, from the 2nd stage onward, the convolutions represented by the Equations (13), (18), (17) and (21)–(25) are implemented to obtain the wavelet coefficient $T_g(2^j, b)$ of each stage and the input signal $S_{j+1}$ for the next stage.

The convolution in each processing unit is implemented over such a range that the absolute value of the Gabor function will become a value $\epsilon$ small enough to be negligible for all practical purposes at both ends thereof.

Further, the above-mentioned processing operations should be performed over a number of stages (10, for example) that will provide practical analytical results.

With regard to the actual processing operations, all of the input signals (input data) are stored temporarily in the storage unit 15. Thereafter, the shift b is fixed and all of the wavelet coefficients are obtained with regard to the fixed shift while the input data that has been stored is read out of the storage unit 15. This processing operation is repeated while changing the shift b.

FIGS. 3a1, 3b1 and 3c1 are examples of waveform diagrams of the input signals $S_0$, $S_1$ and $S_2$ of the 0th stage, 1st stage and 2nd stage, respectively, and FIGS. 3a2, 3b2 and 3c2 illustrate frequency spectrums of respective ones of these input signals $S_0$, $S_1$ and $S_2$. Further, $f_m$ denotes the maximum frequency contained in the input signal $S_0$.

FIGS. 4a, 4b and 4c illustrate the Gabor functions $G_{\alpha,\omega}$, $G_{\alpha/3, 2\omega/3}$ and $G_{\alpha/12, \omega/3}$ used by the convolutions in the processing units 20, 21 and 22 of the 0th, 1st and 2nd stages, respectively.

Figure 5A:
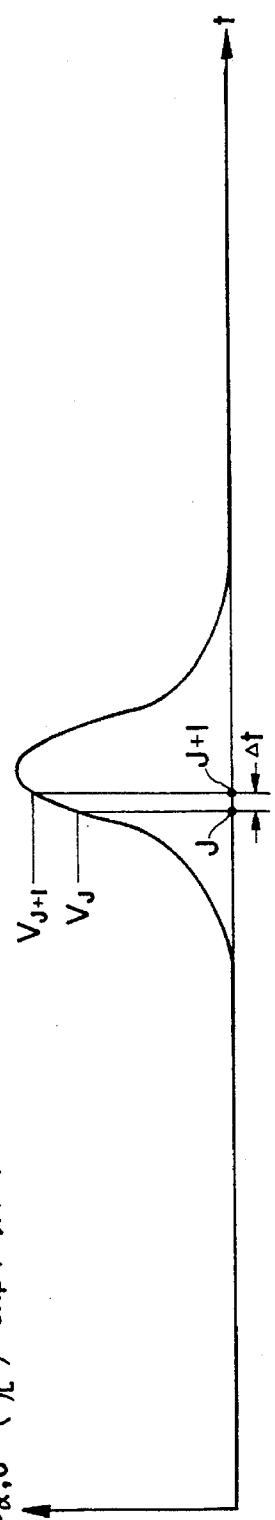
FIGS. 5a, 5b and 5c are waveform diagrams illustrating Gabor functions used as Gaussian-type filters in 0th stage, 1st stage and 2nd stage, respectively.
Figure 5B:
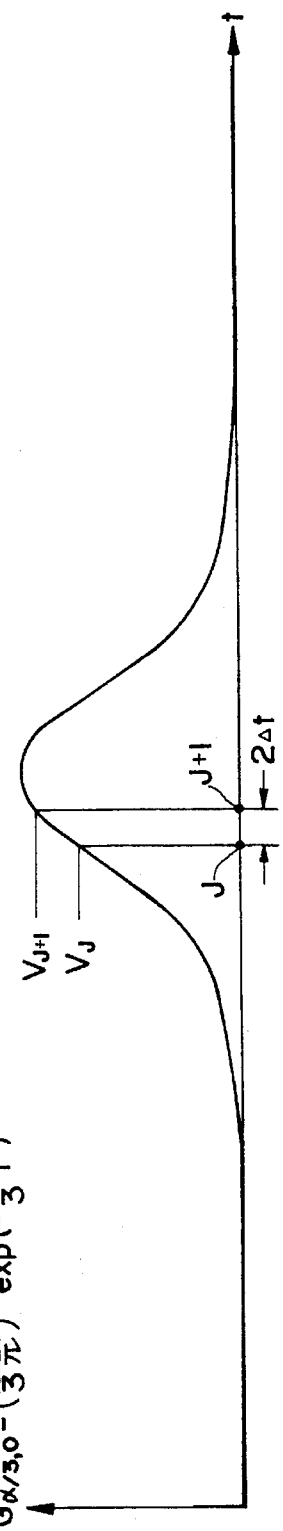
Figure 5C:
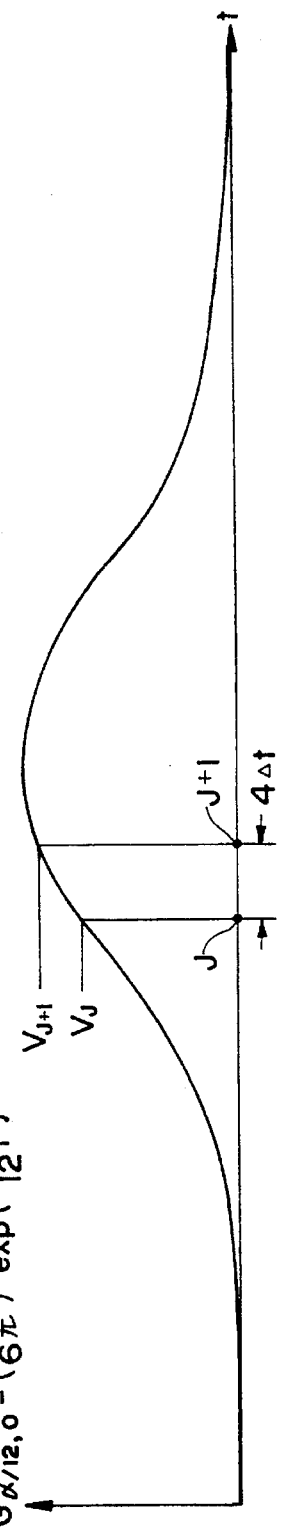

FIGS. 5a, 5b and 5c illustrate the Gabor functions $G_{\alpha,\omega}$, $g_{\alpha/3,0}$ and $G_{\alpha/12,0}$ used by the convolutions in the processing units 30, 31 and 32 of the 0th, 1st and 2nd stages, respectively.

Of great importance here is the fact that there are no oscillatory components, i.e., that $\omega=0$, in the Gabor functions used by the convolutions in the processing units 30, 31, 32, ..., 3j that generate the input signals $S_j$ (j=1, 2, ...) of the next stage. As a consequence, these Gabor functions are Gaussian functions, as illustrated in FIGS. 5a~5c.

A convolution of an input signal and a Gaussian function is equivalent to applying a Gaussian filter, namely a low-pass filter, to the input signal.

Accordingly, as best expressed by FIGS. 3a1~3c1, the higher the number of stages, the more high-frequency components of the input signal $S_j$ are removed. In FIGS. 3a2~3c2, the frequency component strength is expressed as a frequency spectrum. Let $f_m$ represent the maximum frequency possessed by the input signal $S_0$ of the 0th stage. The maximum frequency of the input signal $S_1$ of the 1st stage is halved, i.e., the maximum frequency becomes $f_m/2$. The maximum frequency of the input signal $S_2$ of the 2nd stage is halved, i.e., the maximum frequency becomes $f_m/4$. Thus, as the number of stages rises, the maximum high-frequency component becomes $\frac{1}{2^j}$ of the maximum frequency $f_m$.

This means that even though the processing operations are performed by thinning out the data of the input signal $S_j$ as the number of stages rises so that the data interval (sampling period) is increased by a factor $2^j$, there is no decline in the precision of the processing operations.

Let $\Delta t$ represent the sampling period of the input signal $S_0$ of the 0th stage, as illustrated in FIG. 3a1. The period $\Delta t$ is equal to the sampling period of the A/D converter 12.

The sampling period can be made $2\Delta t$ in the processing units 21 and 31 that perform processing operations using the input signal $S_1$ of the 1st stage, and the sampling period can be made $4\Delta t$ in the processing units 22 and 32 that perform processing operations using the input signal $S_2$ of the 2nd stage. Thus, the higher the stage of the processing unit, the wider the interval of the data used in the processing operations can be made by thinning out the input data.

On the other hand, as will be understood from FIGS. 4a~4c and 5a~5c, the higher the stage, the wider the range in which the absolute value of the Gabor function exceeds the aforesaid value $\epsilon$. In other words, the higher the stage of the processing unit, the wider the range of the convolution. The range of this integral widens at $2^j$.

However, since the sampling period of the input data can be widened at $2^j$ as mentioned above, the sampling period of the Gabor function corresponding to this also can be widened at $2^j$. Even though the range of the convolution widens at $2^j$, the sampling period of the data can be widened at $2^j$. The end result is that a processing operation of the same precision is possible with the same amount of computation regardless of how high the number of the stage is.

It is possible also to make the maximum frequency of the input signal of a succeeding stage 1/M of the maximum frequency of the input signal of the preceding stage (where M is a positive integer other than 1). In this case, the sampling period in the processing unit of the succeeding stage can be made M times the sampling period in the processing unit of the preceding stage. The wavelet coefficient $T_g(M^j,b)$ is obtained from the processing unit 3j of the j-th stage. It goes without saying that if this satisfies Equation (4), a base function other than a Gabor function can be utilized.

(3) Configuration of Wavelet Transformation Unit (Example 1)

Figure 6:
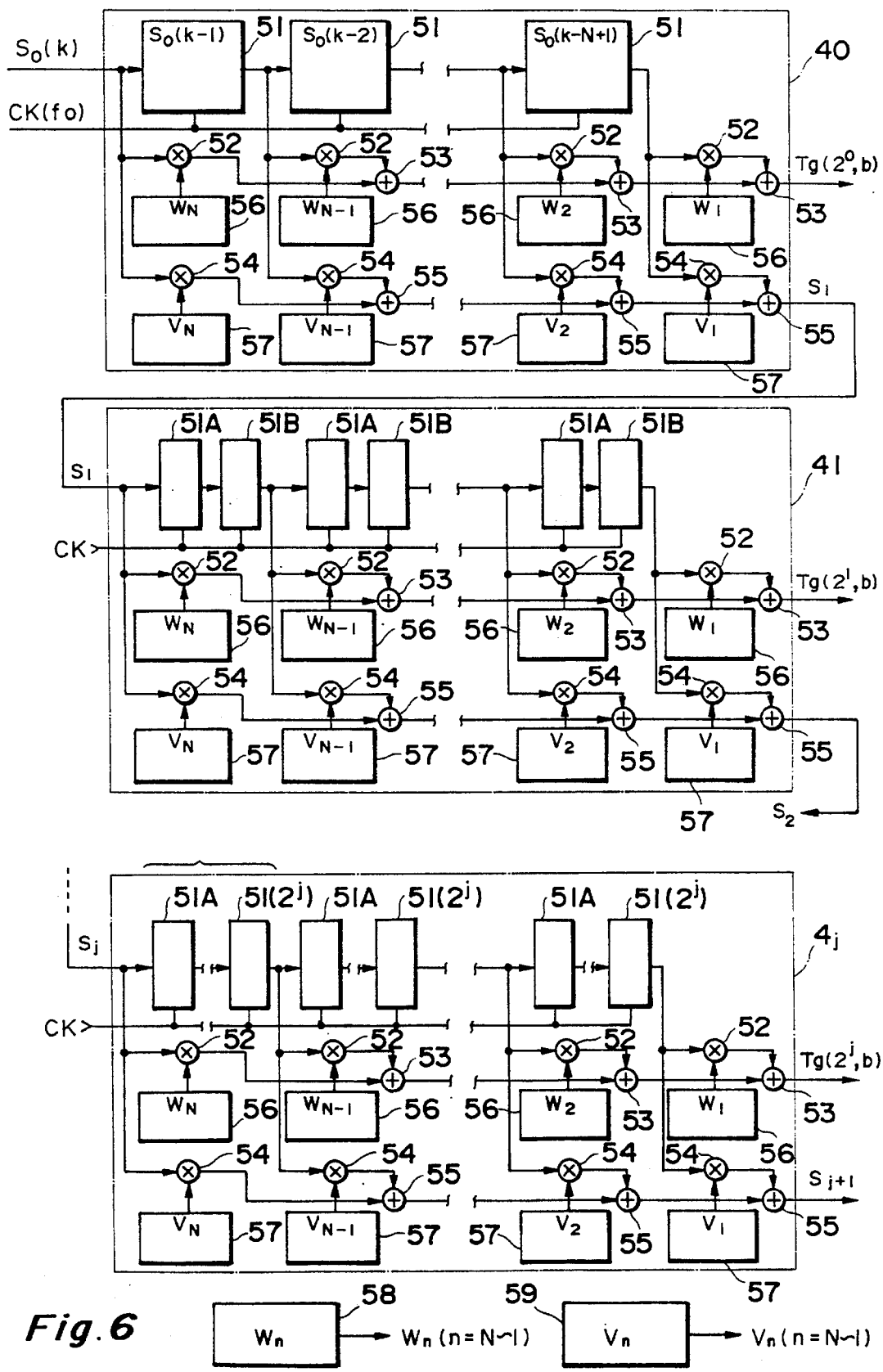
FIG. 6 is a block diagram showing the configuration of a wavelet transformation unit in a first embodiment.

FIG. 6 illustrates an example of the wavelet transformation unit 13 constructed in accordance with the concept described above.

If this arrangement is correlated with the functional block configuration shown in FIG. 2, a processing circuit 40 of a 0th stage in the circuitry illustrated in FIG. 6 will include the processing units 20 and 30 of the 0th stage. Similarly, a processing circuit 41 of a 1st stage corresponds to the first processing units 21 and 31, and a processing circuit 4j of a jth stage corresponds to the processing units 2j and 3j.

The processing circuit 40 of the 0th stage will be described first.

The processing circuit 40 of the 0th stage obtains the 0th wavelet coefficient $T_g(2^0,b)$ in accordance with Equation (7) and obtains the input signal $S_1$ of the 1st stage in accordance with Equation (10).

The Gabor functions $G_{\alpha,\omega}$ and $G_{\alpha,0}$ are used in the Equations (7) and (10). The range of integration of these Gabor functions is subdivided at the sampling period $\Delta t$. Assume that there are N-number of sampling points, that the value of the Gabor function $G_{\alpha,\omega}$ at each sampling point is $W_n$ (n=N~1), and that the value of the Gabor function $G_{\alpha,0}$ at each sampling point is $V_n$ (n=N~1). In FIGS. 4a and 5a, values $W_j$, $W_{j+1}$ and $V_j$, $V_{n+1}$ at sampling points J, J+1 are illustrated as being representative of these Gabor function values.

The data representing these Gabor function values is generated by function generators 58 and 59. The function generators 58 and 59 can be implemented by software or by memories (a ROM or RAM) in which the respective function values $W_n$, $V_n$ calculated in advance have been stored.

Items of data representing respective ones of the Gabor function values $W_n$, $V_n$ generated by the function generators 58 and 59 are stored in latch circuits 56 and 57, respectively.

Shift registers 51 of (N–1)-number of stages are cascade-connected to the processing circuit 40. Clock pulses CK (of frequency $f_0$) are applied to the shift registers 51 so that data that has been stored in a register 51 of a preceding stage is successively shifted to a shift register of the succeeding stage whenever a clock pulse CK arrives. When the input data $S_0(k)$ is applied, past input data $S_0(k+1)~S_0(k-N+1)$ will have been stored in the (N–1)-number of the shift registers. In a case where the input data $S_0(k)$ is applied to the wavelet transformation unit 13 directly from the A/D converter 12, the period of the clock pulses CK is equal to the sampling period $\Delta t$. In a case where the input data $S_0(k)$ is applied upon being read out of the storage unit 15, the period of the clock pulses CK is set to be equal to the data readout cycle of the storage unit 15.

When the Gabor function $G_{\alpha,\omega}$ is expressed discretely using the function values $W_n$ (n=N~1) latched in the latch circuits 56 and the input data string is expressed discretely using the input data $S_0(k)$ and the past input data $S_0(n)$ (n=k–1~k–N+1) that has been stored in the shift registers 51, Equation (7) is expressed by the following discrete equation:

$$T_g(2^0, b) = A_0 \sum_{n=N}^{n=1} S(k-N+n) \cdot W_n \qquad (26)$$

The input data $S_0(k)$ and the items of past input data $S_0(n)$, which have been stored in the shift registers 51, as well as the function values $W_n$ latched in the latch circuits 56, are applied respectively to N-number of corresponding multipliers 52 so that the products of the corresponding items of data are calculated. The products $S(k-N+n) \cdot W_n$ outputted by these multipliers 52 are successively added by N-number of adders 53 during one period of the clock pulses, and the 0th wavelet coefficient $T_g(2^0, b)$ which is represented by the final total sum, is outputted by the adder 53 of the final stage.

When the equation for calculating the input data $S_1$ of the 1st stage represented by Equation (10) also is expressed discretely, the result is as follows:

$$S_1 = B_0 \sum_{n=N}^{n=1} S(k-N+n) \cdot V_n \quad (27)$$

The operation of Equation (27) is performed by N-number of multipliers 54 and N-number of adders 55 (i.e., by low-pass filtering) in exactly the same manner as the calculation of the wavelet coefficients so that input data $S_1$ of the 1st stage is outputted. This input data $S_1$ is applied to the processing circuit 41 of the 1st stage.

The processing circuit 41 of the 1st stage is provided with 2(N-1)-number of each of shift registers 51A, 51B for successively shifting the input data S1 in response to the clock pulses, and these shift registers are connected in cascade. The output data of every other shift register, namely shift register 51B, is applied to the multipliers 52, 54. The reason for this is that the sampling interval can be made 2Δt in the processing circuit 41 of the 1st stage, as set forth above, so that every other item of input data $S_1$ is used in the processing operations.

The function values $W_n$, $V_n$ that are exactly the same as those in the latches 56, 57 in the processing circuit 40 of the 0th stage are stored in the latch circuits 56, 57, respectively. The reason for this is that since the range of the Gabor function used in the processing operations of the 1st stage becomes twice the range of the Gabor function used in the 0th stage and, moreover, the sampling period also is doubled, as will be understood from a comparison of FIGS. 4a and 4b and a comparison of FIGS. 5a and 5b, exactly the same function data can be used.

The processing circuit 40 of the 0th stage and the processing circuit 41 of the 1st stage are identically constructed except for the fact that the number of shift registers in the processing circuit 41 of the 1st stage is twice the number of shift registers in the processing circuit 40. These processing circuits operate in exactly the same manner. More specifically, the data in the shift registers 51A, 51B is shifted one stage at a time at the period of the clock pulses, the wavelet coefficient $T_g(2^1,b)$ is produced by the multipliers 52 and adders 53 using the input data from the 0th stage and the input data that has been stored in every other one of the shift registers, namely the shift registers 51B, and input data S2 for the processing circuit of the next stage (the 2nd stage) is produced by the multipliers 54 and adders 55 (i.e., by low-pass filtering). Since the output data of every other one 51B of the shift registers is used in order to implement the processing operations, the sampling period is 2Δt. Since the processing operations are executed at the period of the clock pulses CK, the wavelet coefficient $T_g(2^1,b)$ and the input data $S_2$ of the next stage are obtained at each period of the clock pulses CK.

If the processing circuit 4j of the j-th stage also is compared with the processing circuit 40 of the 0th stage, it is seen that the construction thereof is identical with that of the processing circuit 40 with the exception of the fact that the number of shift registers is increased by a factor $2^j$. The shift registers 51A~51($2^j$) perform shift operations in synchronism with the clock pulses CK, the input data from the preceding stage and the output data from the shift registers 51($2^j$) at intervals of ($2^{j+1}-1$) is applied to the multipliers 52, 54, and $T_g(2^j,b)$ and $S_{j+1}$ are calculated thereby. The sampling period is $2^j\Delta t$. Further, $T_g(2^j,b)$ and $S_{j+1}$ are obtained every period of the clock pulses CK.

Though the coefficients $A_0, A_1, A_2, A_2, \ldots, B_0, B_1, B_2, \ldots$ are not discussed in the foregoing description relating to FIG. 6, these coefficients can be incorporated in the processing by providing each of the processing circuits 40, 41, 4j with a coefficient unit or by performing processing in which these coefficients are applied for multiplication in the multipliers 52, 54 or adders 53, 55. Further, it goes without saying that clock pulses of a frequency higher than that of the clock pulses (of frequency $f_0$) may be applied to the multipliers 52, 54 and adders 53, 55, and operations of latching, multiplying or adding of the input data and outputting of the results of processing operations may be performed in synchronism with these high-frequency clock pulses.

In the embodiment described above, the items of input data $S_0, S_1, S_2$ are take part in multiplication upon being applied directly to the multipliers 52, 54 in the processing circuits 40, 41, 4j of each stage. However, an arrangement may be adopted in which these items of data are stored in the shift registers 51, 51A, 51B, 51A~51($2^j$) temporarily before being applied to the multipliers 52, 54. In such case the numbers of shift registers required in the processing circuits 40, 41, 4j would be N, 2N and $2^j$N, respectively.

In a case where the frequency components are reduced to 1/M rather than half and the sampling interval is increased by a factor M, the numbers of shift registers of the 0th, 1st, . . . , j-th stages will be N, M·N, . . . $M^j$·N. The wavelet coefficient $T_g(M^j,b)$ will be calculated in the processing circuit 4j of the j-th stage.

(4) Configuration of Wavelet Transformation Unit (Example 2)

As should be evident from the configuration of the processing circuits shown in FIG. 6, the 0th through j-th processing circuits are identically constructed except for the shift registers. This means that except for the shift registers, common use can be made of one processing circuit for the purpose of performing the processing operations of all stages.

Figure 7:
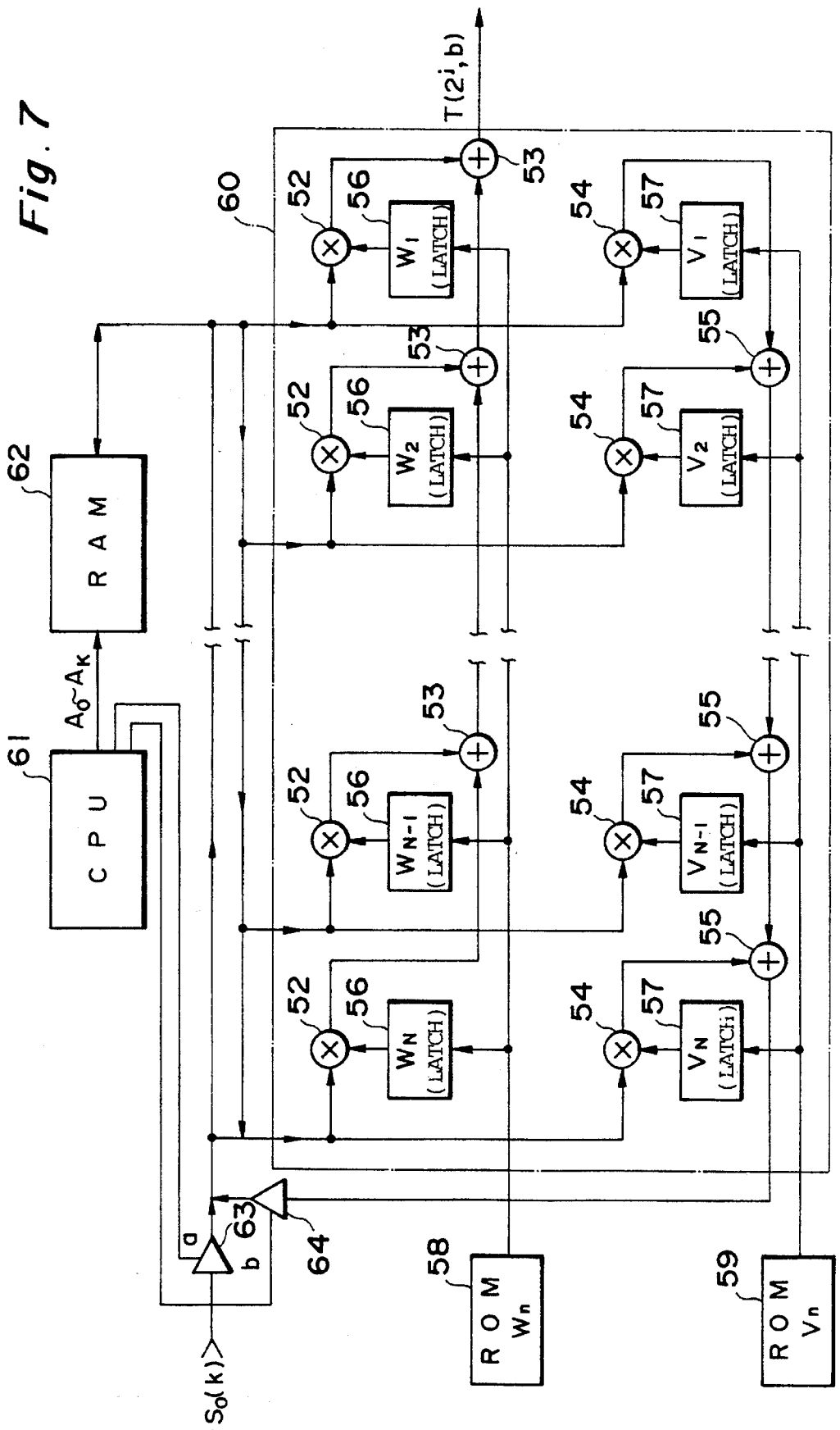
FIG. 7 is a block diagram showing the configuration of a wavelet transformation unit in a second embodiment.
Figure 8:
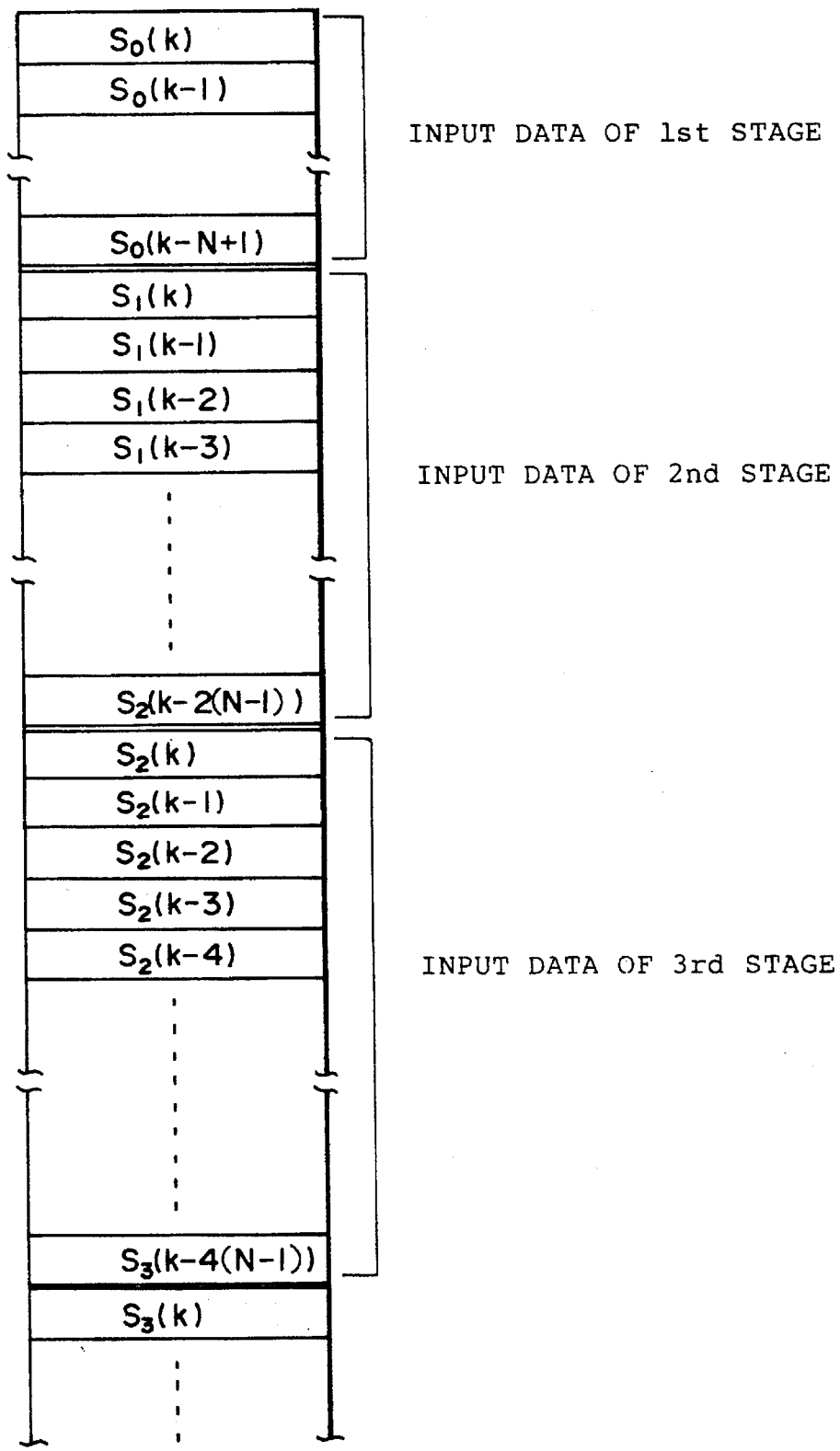
FIG. 8 illustrates storage areas of a RAM in the second embodiment.

FIG. 7 illustrates an embodiment in which the circuit configuration is simplified by using one processing circuit, with the exception of the shift registers, commonly for the processing operations of all stages. Instead of the shift registers, a RAM 62 is provided in order to store the data used in the processing of each stage. The RAM 62 is provided with areas that store the input data of each stage, as shown in FIG. 8. There are N items of input data $S_0(k)$~$S_0(k-N+1)$ for the processing operation of the 0th stage. These items of data are successively applied directly from the A/D converter 12 or by being read out of the storage unit 15. There are 2N items of input data $S_1(k)$~$S_1(k-2N+1)$ for the processing operation of the 1st stage. These items of data are the input data $S_1$ obtained by the low-pass filtering operation in the 0th stage. Similarly, the input data of the j-th stage is the input data to the next stage obtained by the low-pass filtering in the (j-1)th stage. There are $2^j$N items of this data stored.

A processing circuit 60 has a construction obtained by deleting the shift registers from the processing circuits shown in FIG. 6. Circuits identical with those described earlier are designated by like reference characters and a redundant description thereof is avoided. The function of the shift registers, namely the storing of input data, is implemented by the RAM 62.

A CPU 61 is provided in order to control the writing and reading of input data to and from the RAM 62, the entry of input data to the processing circuit 60 and the output of data therefrom. The CPU 61 outputs address signals $A_0$~$A_K$ and read/write signals (not shown) to the RAM 62. A three-state buffer 63 is provided in order to control the acceptance of the input data $S_0(k)$ of the 0th stage, and a three-state buffer 64 is provided in order to control the acceptance of input data $S_j$ (j=1, 2, ...) for the processing operation of the next stage, this data being obtained from the processing circuit 60. The buffers 63, 64 are controlled by respective control signals a, b provided by the CPU 61.

Figure 9:
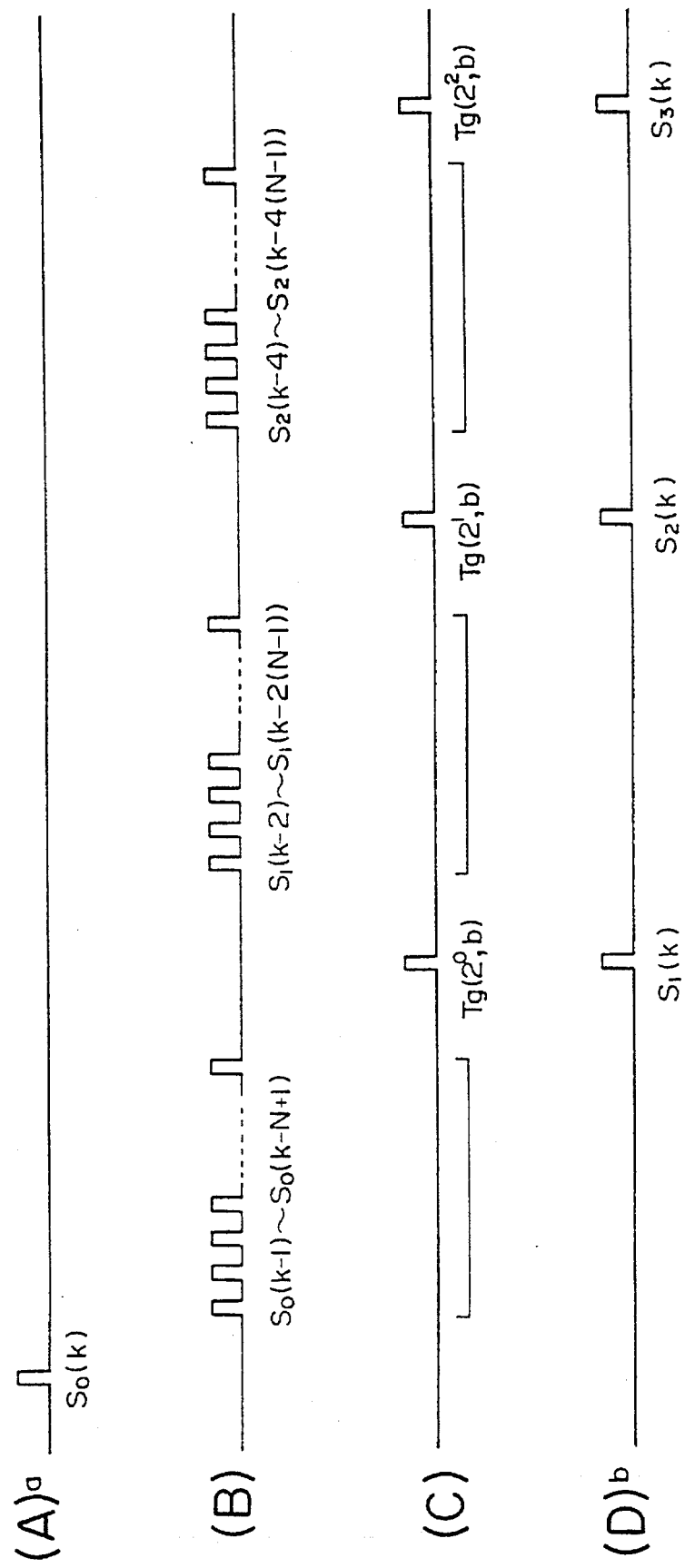
FIG. 9 is a time chart illustrating the operation of the unit in the second embodiment.

The operation of the wavelet transformation apparatus shown in FIG. 7 will now be described while referring to the time chart illustrated in FIG. 9.

When the input data $S_0(k)$ for the processing operation of the 0th stage is applied, the three-state buffer 63 is rendered conductive so that the input data $S_0(k)$ is latched in each of the multipliers 52, 54 of the initial stage in processing circuit 60 (multiplication with $W_M$ or $V_N$ may be performed at the same time) and read in the RAM 62. At this time the items of input data $S_0(k-1) \sim S_0(k-N)$ that have been stored in the RAM 62 are shifted one item at a time so that the oldest data $S_0(k-N)$ is erased. The (N−1)-number of items of input data $S_0(k-1) \sim S_0(k-N+1)$, other than the input data $S_0(k)$, for the 0th stage are then successively read out of the RAM 62 and each is applied to the corresponding multipliers 52, 54 in the processing circuit 60 via a bus. The operation represented by Equation (26) is performed by the multiplier 52 and adder 53 so that the wavelet coefficient $T_g(2^0,b)$ is outputted. The coefficient $T_g(2^0,b)$ obtained is stored in the RAM 62 or storage unit 15.

Further, the input data $S_1(k)$ for the 1st stage is obtained by performing the operation (low-pass filtering) in accordance with Equation(26) by means of the multipliers 54 and adders 55, and this input data is read in and stored in the RAM 62 via the three-stage buffer 64, which has been rendered conductive. At this time the input data $S_1(k-1) \sim S_1[k-2(N-1)-1]$ of the 1st stage is successively shifted so that the oldest data $S_1[k-2(N-1)-1]$ is erased. This is the same as in the case of the data of 0th stage.

The processing operation of the 1st stage is performed in the next period. That is, of the input data $S_1(k) \sim S_1[k-2(N-1)]$ of the 1st stage, N items of data $S_1(k)$, $S_1(k-2)$, $S_1[k-2(N-1)]$, which is every other item of input data, are successively read out and applied to the multipliers 52, and the wavelet coefficient $T_g(2^1,b)$ of the 1st stage is obtained by the multipliers 52 and adders 53. This wavelet coefficient $T_g(2^1,b)$ also is stored in the RAM 62 or storage unit 15.

The N items of data $S_1(k) \sim S_1[k-2(N-1)]$ read out of the RAM 62 are also applied to the multipliers 54 so that the input data $S_2(k)$ of the 2nd stage is calculated by the multipliers 54 and adders 55 (this is low-pass filtering). The input data $S_2(k)$ of the 2nd stage is applied to the RAM 62 via the buffer 64, this data is stored in the RAM 62 as the latest input data, and the input data of the 2nd stage in RAM 62 is shifted one item at a time.

The processing operation of the 2nd stage is performed in the next period. More specifically, of the $2^2N$ items of input data $S_2(k) \sim S_2[k-4(N-1)]$ of the 2nd stage, N items of data $S_2(k)$, $S_1(k-4)$, ..., $S_2[k-4(N-1)]$, which is input data at an interval of $(2^2-1)$ items of data, are successively read out and applied to the multipliers 52, 54. The wavelet coefficient $T_g(2^2,b)$ is calculated by the multipliers 52 and adders 53, and the input data $S_3(k)$ of the 3rd stage is calculated by multipliers 54 and adders 55.

Thereafter, and in similar fashion, the storing in RAM 62 of the input data $S_j(k)$ for the next stage j, which data is generated by the processing circuit 60, the shifting of the input data of the j-th stage in the RAM 62, the reading out of input data at an interval of $(2^j-1)$ items of data from the RAM 62 and the generating of the wavelet coefficient $T_g(2^j,b)$ and input data $S_{j+1}(k)$ in the next stage in the processing circuit 60 are performed.

When the processing operations in a prescribed stage determined in advance end, the next item of data $S_0(k+1)$ is applied and the processing operations from the 0th stage to the prescribed stage are repeated in a similar manner.

Of course, if the storage capacity of the RAM 62 is sufficient, the processing operation of the 1st stage may be implemented at the conclusion of all processing of the 0th stage so that processing may be executed stage by stage.

More specifically, the input data $S_0(k)$ for the 0th stage is successively applied to the processing circuit 60 at a fixed period to obtain the wavelet coefficient $T_g(2^0,b)$ as well as the input data $S_1(k)$ for the 1st stage. All of the obtained input data $S_1(k)$ for the 1st stage is stored in the RAM 62.

When the processing operation of the 0th stage using all of the input data $S_0(k)$ for the 0th stage ends, every other item of input data $S_1(k)$ for the 1st stage stored in the RAM 62 is successively read out N items at a time, this data is applied to the processing circuit 60 at the fixed period and the wavelet coefficient $T_g(2^1,b)$ and input data $S_2(k)$ for the 2nd stage are obtained. The input data $S_2(k)$ is stored in the RAM 62.

When the processing operation of the 1st stage ends, every fourth item of input data $S_2(k)$ for the 2nd stage is successively read out N items at a time and the processing operation of the 2nd stage is executed using the processing circuit 60. The input data $S_3(k)$ for the 3rd stage obtained by the processing operation of the 2nd stage is stored in the RAM 62.

Thereafter, and in similar fashion up to the prescribed stage, the input data is successively read out of the RAM 62 N items at a time while making the interval of extraction (sampling) of the input data, obtained by the processing operation of the preceding stage, $(2^j-1)$, and the processing circuit 60 is utilized to perform the calculation of the wavelet coefficients and the calculation of the input data for the next stage.

(5) Configuration of Wavelet Transformation Unit (Example 3)

With the wavelet transformation unit shown in FIG. 7, multiplication and addition are implemented by electrical circuitry, the storage of input data is performed using a memory, and the electrical circuitry and writing/reading of the input data to and from the memory are controlled by the CPU 61. By developing this arrangement further, the CPU 61 can be made to execute the multiplication and addition.

In such case, the memory is provided with areas for storing the Gabor-function values $W_N \sim W_1$, $V_N \sim V_1$, that have been stored in the latche circuits 56, 57, in addition to the areas for storing the input data of the kind shown in FIG. 8.

Figure 10:
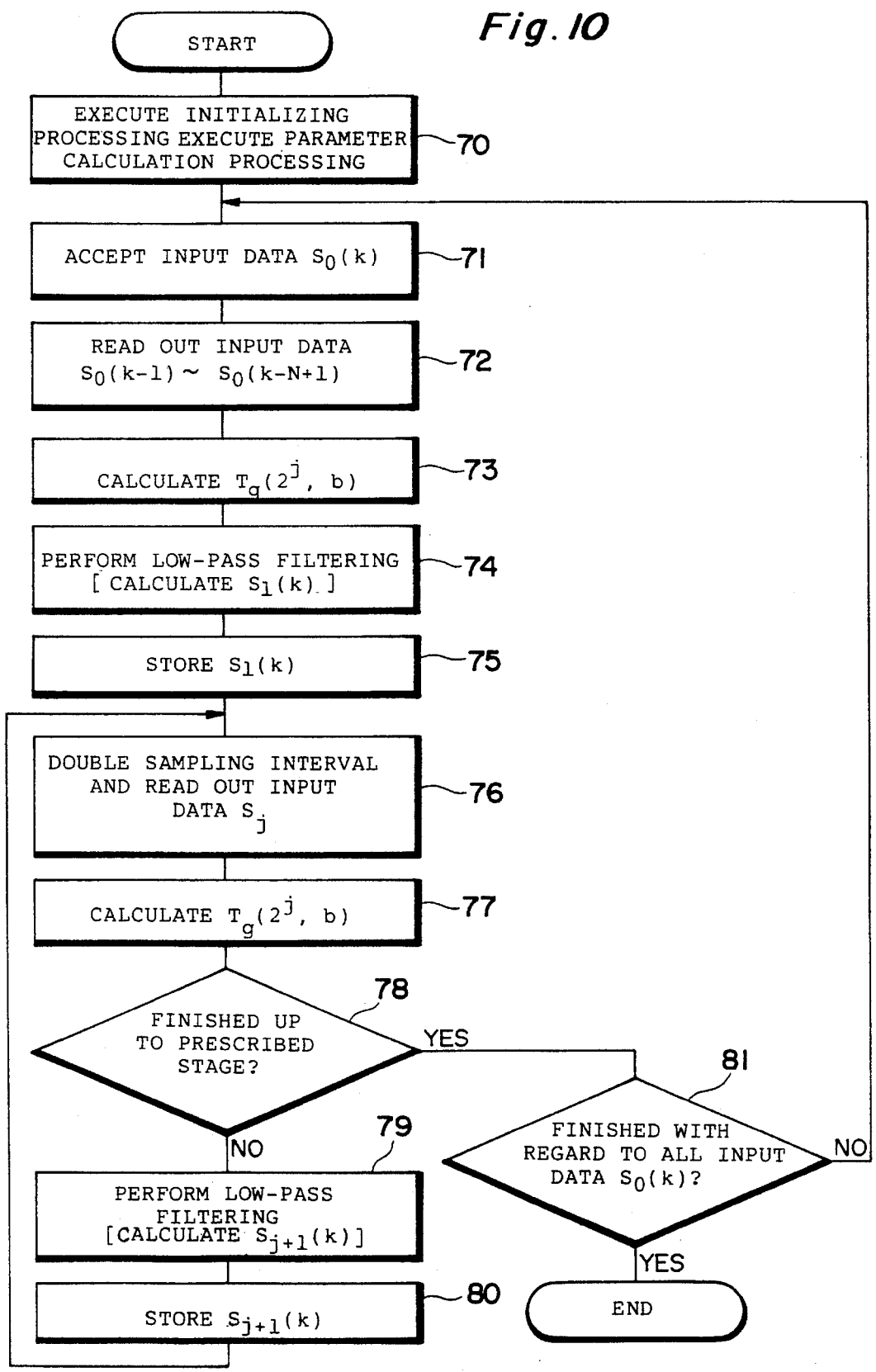
FIG. 10 is a flowchart illustrating a processing procedure in a third embodiment of the wavelet transformation unit.

FIG. 10 illustrates a processing procedure implemented when the calculation of the wavelet coefficient $T_g(2^j, b)$ and the processing operation (low-pass filtering) of the input data $S_j(k)$ for calculation of the wavelet coefficient of the next stage are executed by a CPU.

It will be assumed that all of the input data $S_0(k)$ applied through the A/D converter 12 has been stored in the storage unit 15.

The areas (see FIG. 8) of the memory that store the input data are initialized (cleared), parameters such as the Gabor-function values $W_N \sim W_1$ used in order to obtain the coefficients of the wavelet transform and the filter coefficients (Gabor-function values in case of ($\omega$=0) $V_N \sim V_1$ for low-pass filtering are calculated, and these parameters are stored in the memory (step 70).

In order to calculate the wavelet coefficient $T_g(2^0,b)$ of the 0th stage, one item of input data $S_0(k)$ is accepted from the memory and (N−1) items of past input data $S_0(k−1)$~$S_0(k−N+1)$ stored in the memory are read out (steps 71, 72). Since the memory has been cleared, all or part of the input data $S_0(k−1)$~$S_0(k−N+1)$ is 0 in the transient state. The accepted input data $S_0(k)$ is stored in the memory and shift processing of the input data for the processing operation of the 0th stage in the memory is executed.

The wavelet coefficient $T_g(2^0,b)$ of the 0th stage is calculated using the data $S_0(k)$~$S_0(k−N+1)$ and $W_N$~$W_1$ in accordance with Equation (26) mentioned above (step 73). The wavelet coefficient $T_g(2^0,b)$ obtained is stored in the storage unit 15.

The operation of low-pass filtering is then performed in accordance with Equation (27) using the data $S_0(k)$~$S_0(k−N+1)$ and $V_N$~$V_1$, and the input data $S_1(k)$ for calculating the wavelet coefficient in the 1st stage is calculated (step 74). Shift processing of the input data $S_1$ stored in the memory for the processing operation of the 1st stage and read-in of the obtained input data $S_0(k)$ to the memory are performed (step 75).

The processing operations for wavelet transformation from the 1st stage to the prescribed stage are implemented by repeating the processing of steps 761–80.

In the processing of the j-th stage, N items of the input data $S_j$ for the j-th stage stored in the memory are read out of the memory (step 76) at an interval (an interval increased by a factor $2^j$ in comparison with that of the 0th stage) twice that of the sampling interval in the preceding stage (j−1), and the wavelet coefficient $T_g(2^j,b)$ is calculated (step 77) using the data that has been read out as well as the function values $W_N$~$W_1$. The coefficient $T_g(2^j,b)$ calculated is stored in the storage unit 15.

In a case where the frequency component is reduced to 1/M rather than halved and the sampling interval is increased by a factor M, the wavelet coefficient $T_g(M^j,b)$ is calculated by accessing the memory of the j-th stage every $(M^j−1)$ items of data.

If the prescribed stage determined in advance has not been reached (step 78), the input data $S_{j+1}(k)$ of the next stage is calculated (low-pass filtering is performed) (step 79) using the input data read out at step 76 as well as the function values $V_N$~$V_1$. The calculated input data $S_{j+1}(k)$ is stored in the memory and the input data of the (j+1)th stage in the memory is shifted one item at a time (step 80).

When the wavelet coefficient of the final stage determined in advance is obtained (YES at step 78) by repeating the steps 79, 80, 76, 77, the program returns to step 71, the next input data is read out of the storage unit 15 and the processing of steps 71–80 is repeated.

One wavelet transformation is completed when the above-described processing ends for all input data $S_0$ stored in the storage unit 15.

The wavelet transformation processing of FIG. 10 is repeated as described above while the value of the parameter b is changed.

In this embodiment also it may be so arranged that first the processing of the 0th stage is performed using all of the input data $S_0$, the wavelet coefficient $T_g(2^0,b)$ obtained as a result is stored in the storage unit 15 and the input data $S_1$ of the 1st stage is stored in the memory. Next, the processing of the 1st stage is performed using the input data $S_1$ and processing proceeds to that of the 2nd stage after all the processing operations of the 1st stage end.

(6) Post-Processing of Results of Wavelet Analysis

An example of the results of wavelet analysis and of post-processing of the analytical results executed by the post-processor 14 will now be described.

Figure 11:
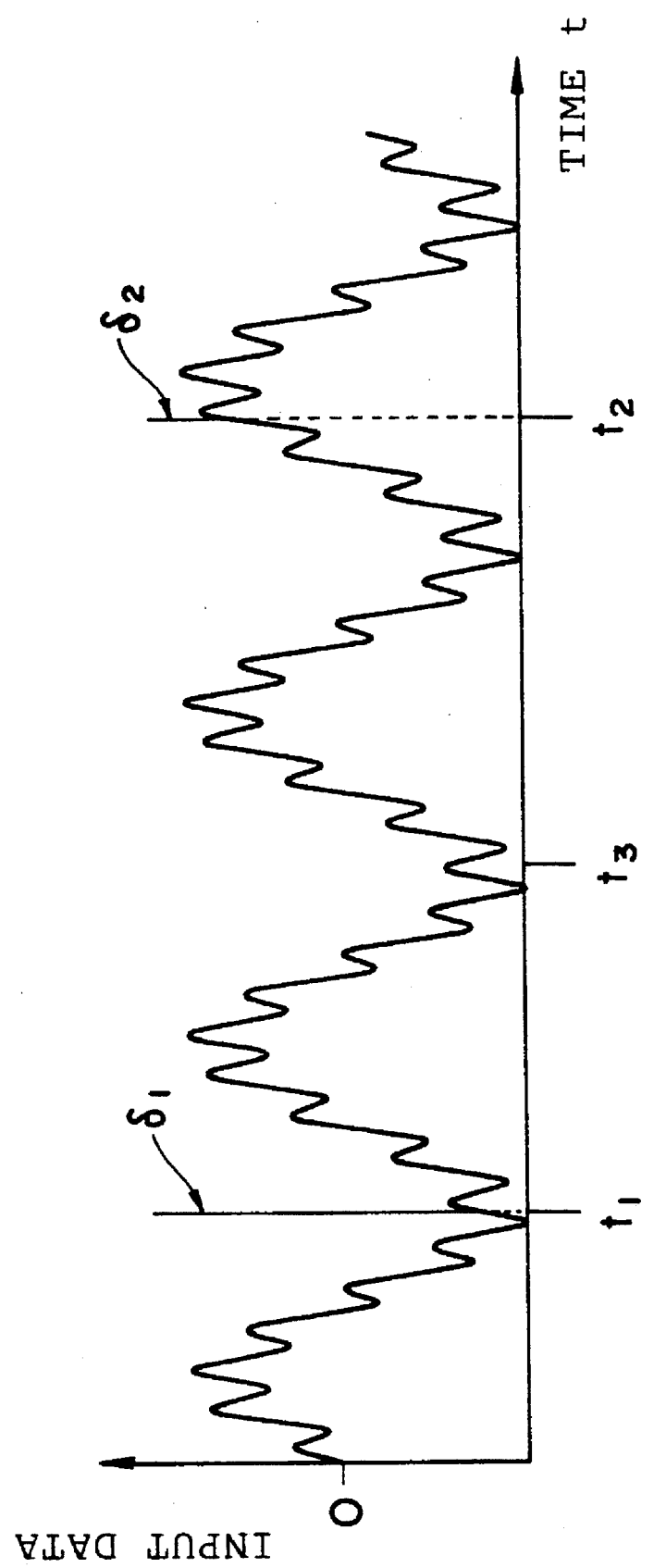
FIG. 11 is a waveform diagram showing an example of an input signal waveform.

FIG. 11 illustrates an example of an input signal (input data). The input signal basically is composed of two superimposed sinusoidal signals having different frequency components, with impulses (noise components) impressed thereon at times $t_1$ and $t_2$. Let $\omega_1$, $\omega_2$ represent the frequencies of the sinusoidal signals, $D_1$, $D_2$ the amplitudes and $\psi_1$, $\psi_2$ the phases thereof. Further, if let delta functions $\delta(t_1)$, $\delta(t_2)$ represent the impulse noise, then the input signal S(t) may be expressed the following equation:

$$S(t)=D_1\sin(\omega_1 t+\psi_1)+D_2\sin(\omega_2 t+\psi_2)+\delta(t_1)+\delta(t_2) \quad (28)$$

In a case where such an input signal is subjected to Fourier analysis, the two frequency components $\omega_1$, $\omega_2$ can be detected but the positions (times $t_1$, $t_2$) of the impulse noise cannot.

In accordance with wavelet analysis, on the other hand, it is possible to recognize not only the two frequency components $\omega_1$, $\omega_2$ but also the existence of the impulse noise and its positions on the time axis.

Figure 12:
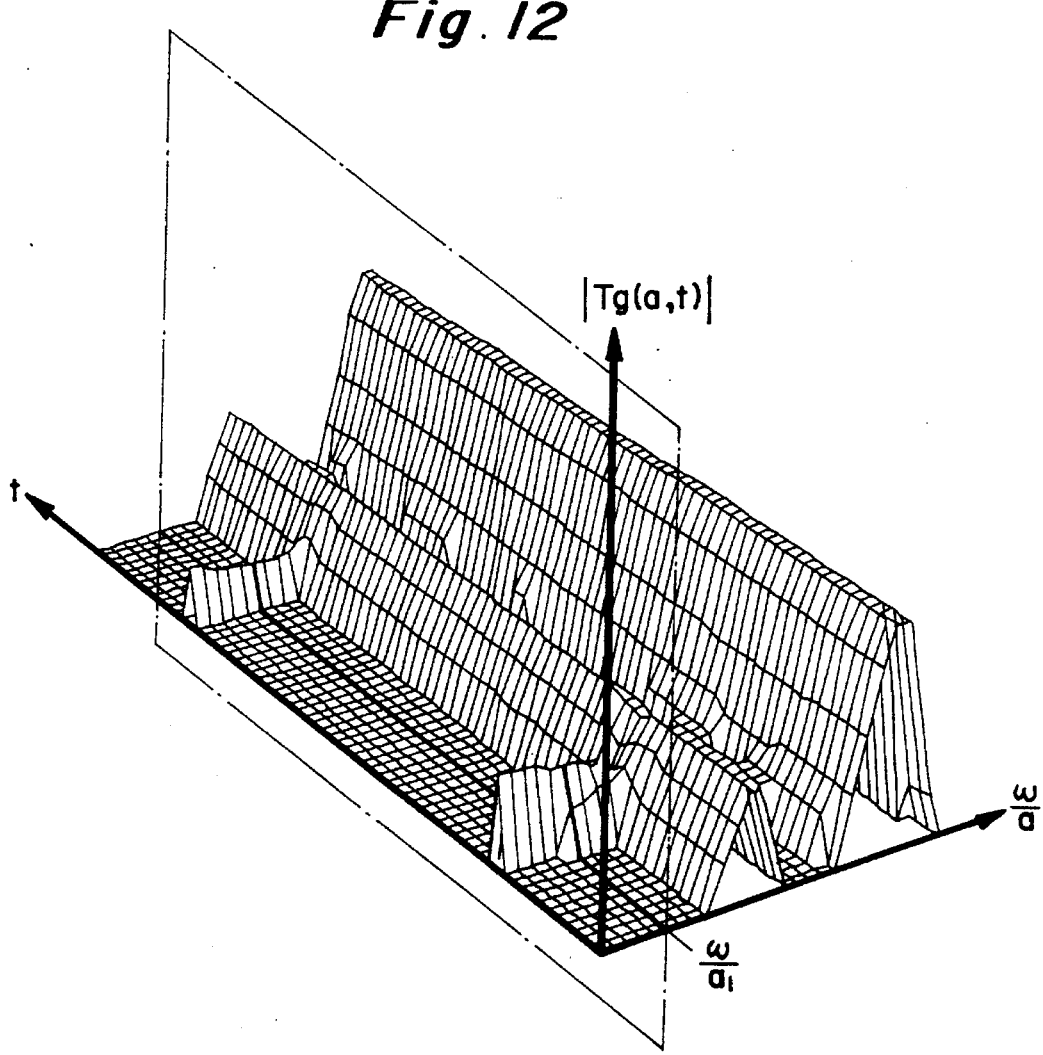
FIG. 12 is a graph showing wavelet coefficient strength obtained by the wavelet transform.

FIG. 12 illustrates an example of the result of wavelet analysis. The vertical axis shows the absolute value $|T_g(a,t)|$ of wavelet coefficient (wavelet coefficient strength). Here the shift b is represented by time t. The two mutually orthogonal horizontal axes perpendicularly intersecting the vertical axis represent frequency $\omega/a$ (this is a value obtained by dividing the center frequency $\omega$ by the scale a) and time t.

Figure 13:
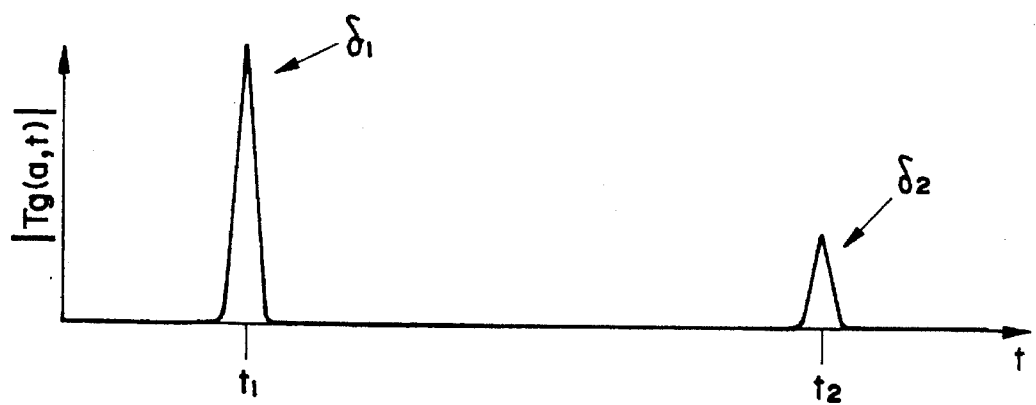
FIG. 13 is a graph showing a frequency cross section of wavelet coefficient strength.

FIG. 13 shows a graph in which this result of wavelet analysis is represented in a cross section obtained by cutting the analytical result by a plane passing through a certain frequency $\omega/a_1$ and lying parallel to a plane comprising the $|T_g(a,t)|$ axis and the t axis. Pulse waveforms corresponding to the delta functions $\delta_1$, $\delta_2$ representing the impulse noise appear in the cross section at times $t_1$ and $t_2$. The existence of the impulse noise and its positions $t_1$, $t_2$ on the time axis can be detected from this graph. The graph illustrated in FIG. 13 obtained by such post-processing is displayed on the display unit 17 or outputted from the output unit 18.

Figure 14:
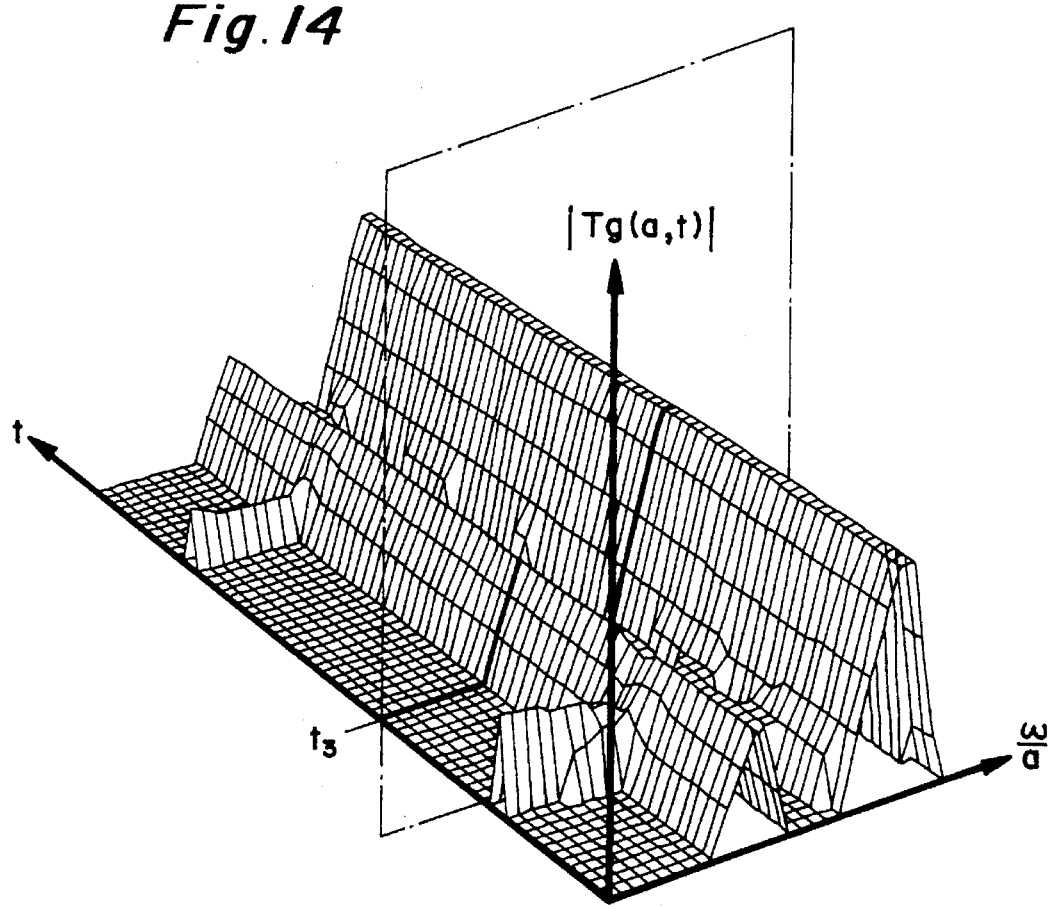
FIG. 14 is a graph showing wavelet coefficient strength.

FIG. 14 shows the manner in which the result of wavelet analysis depicted in FIG. 12 is cut by a plane passing through a time $t_3$ (where $t_3$ need not be a time simultaneous with $t_1$ or $t_2$) between the times $t_1$ and $t_2$ and lying parallel to a plane comprising the $|T_g(a,t)|$ axis and the $\omega/a$ axis.

Figure 15:
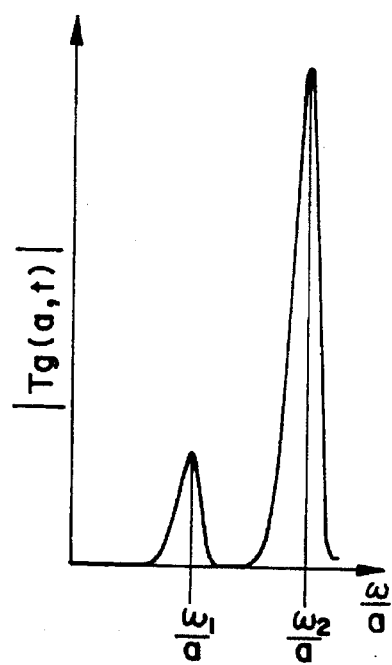
FIG. 15 is a graph showing a time cross section of wavelet coefficient strength.

FIG. 15 shows a graph which appears in the cross section obtained by the cut. Frequency spectra appear in the graph at positions $\omega_1/a$, $\omega_2/a$ corresponding to the two frequency components ($\omega_1$, $\omega_2$). It can thus be determined that the input signal contains the two frequency components $\omega_1$, $\omega_2$. The graph of FIG. 15 obtained by this post-processing also is displayed on the display unit 17 or printed out by the output unit 18.

Figure 16:
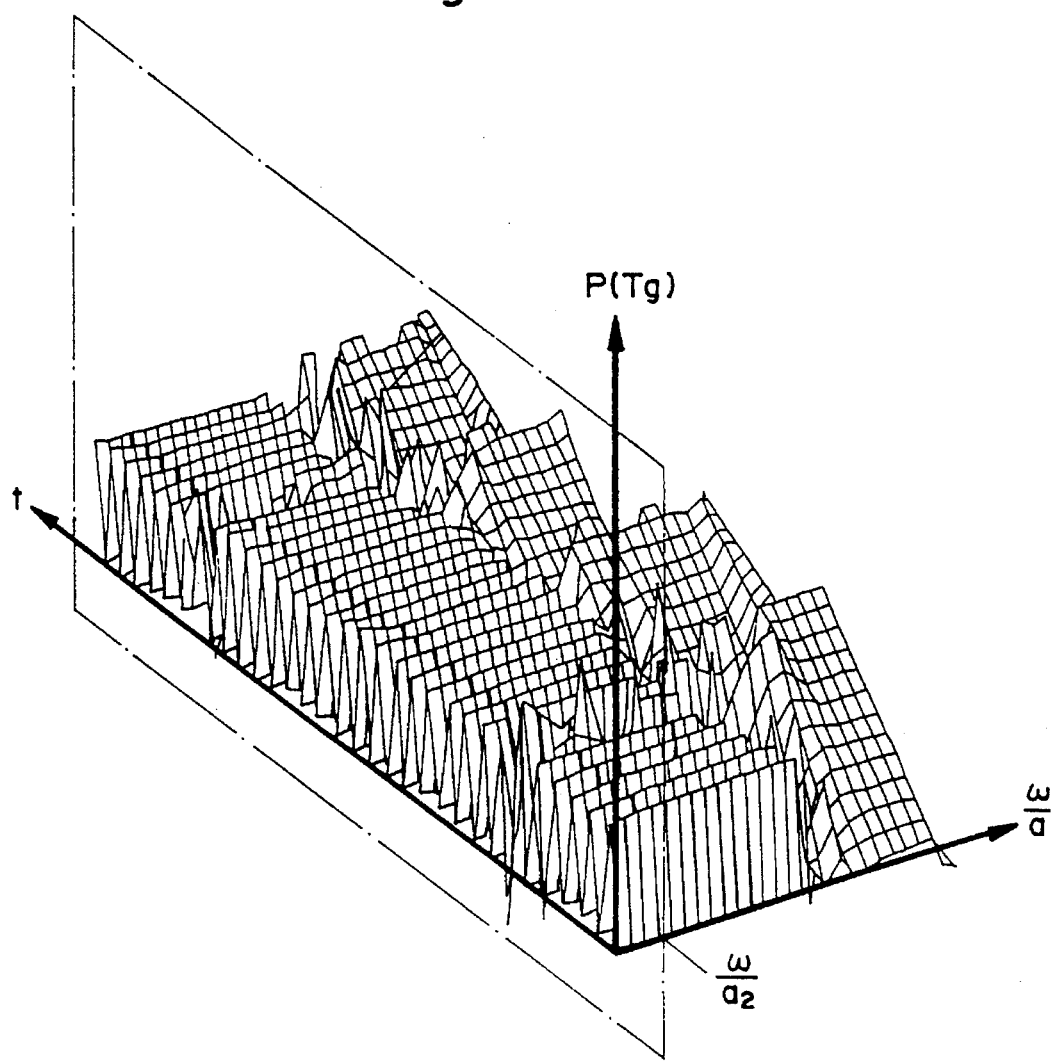
FIG. 16 is a graph showing wavelet coefficient phase obtained by the wavelet transform.

FIG. 16 illustrates another example of the result of wavelet analysis. The vertical axis shows the phase of wavelet coefficients [phase strength, which is represented by $P(T_g)$]. The horizontal axes show $\omega/a$ and t.

Figure 17:
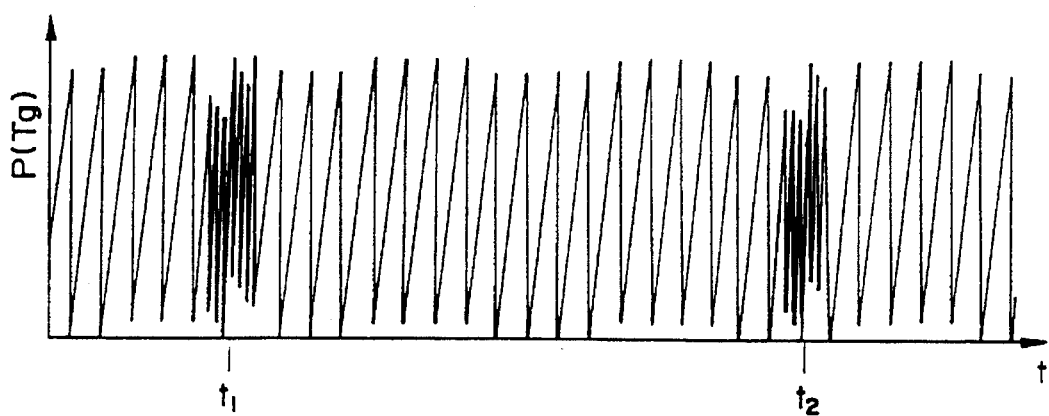
FIG. 17 is a graph showing a frequency cross section of wavelet coefficient phase.

A graph representing change in phase of the kind shown in FIG. 17 appears in a cross section obtained by cutting this analytical result by a plane passing through a certain frequency $\omega/a_2$ and lying parallel to a plane composed of the $P(T_g)$ axis and t axis. The phase is disturbed at times $t_1$, $t_2$, at which noise mixes in the signal. The existence of noise at these times can thus be ascertained. The phase in the other parts of the signal varies in a regular manner.

Figure 18:
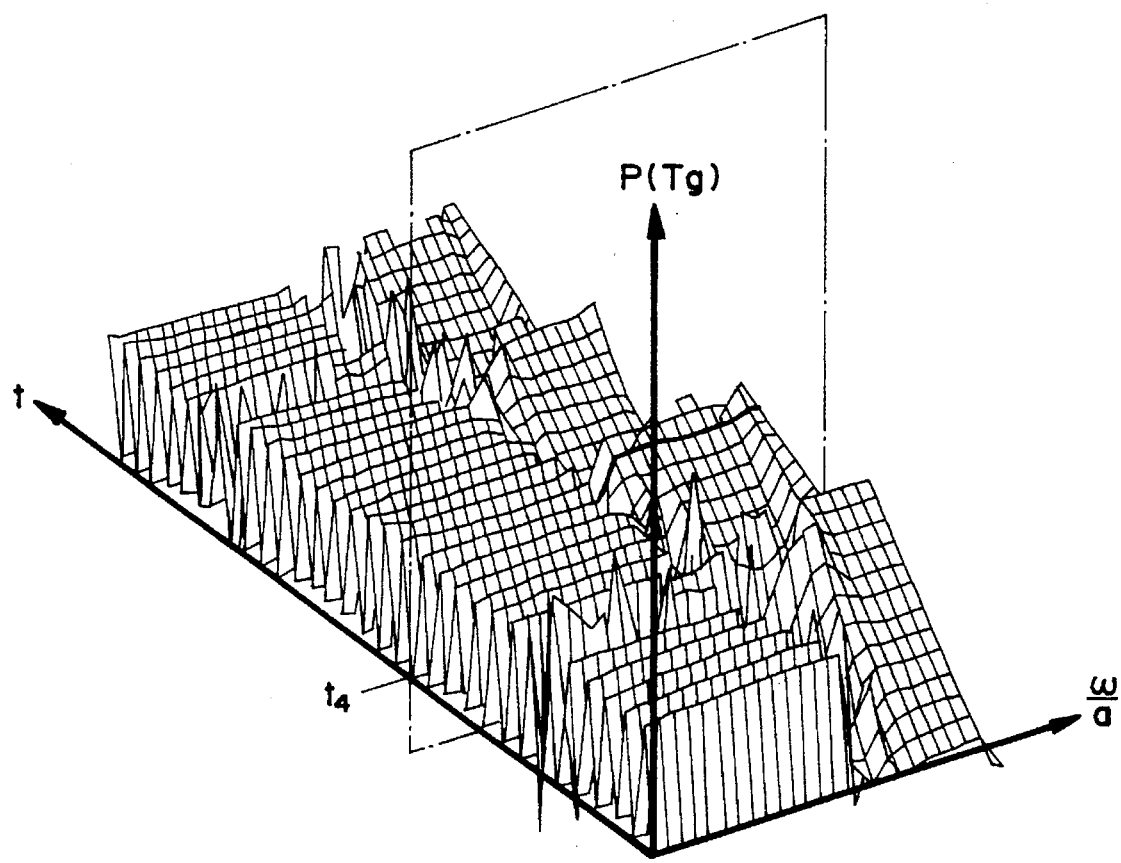
FIG. 18 is a graph showing wavelet coefficient phase.
Figure 19:
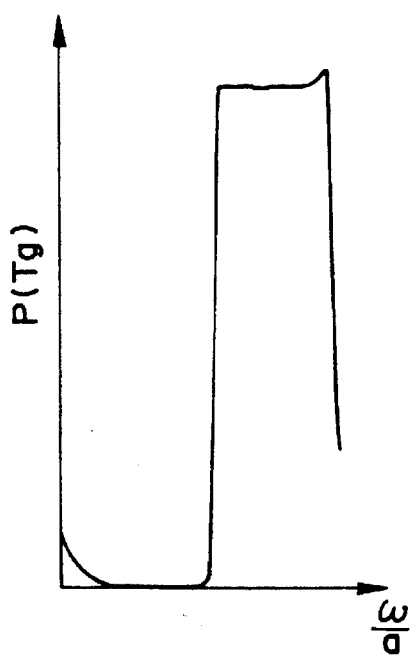
FIG. 19 is a graph showing a time cross section of wavelet coefficient phase.

FIG. 18 shows the manner in which the result of wavelet analysis depicted in FIG. 16 is cut by a plane passing through a time $t_4$ other than times $t_1$ or $t_2$ and comprising the PT$_g$ axis and ω/a axis. FIG. 19 illustrates the change in phase in this cross section.

Figure 20:
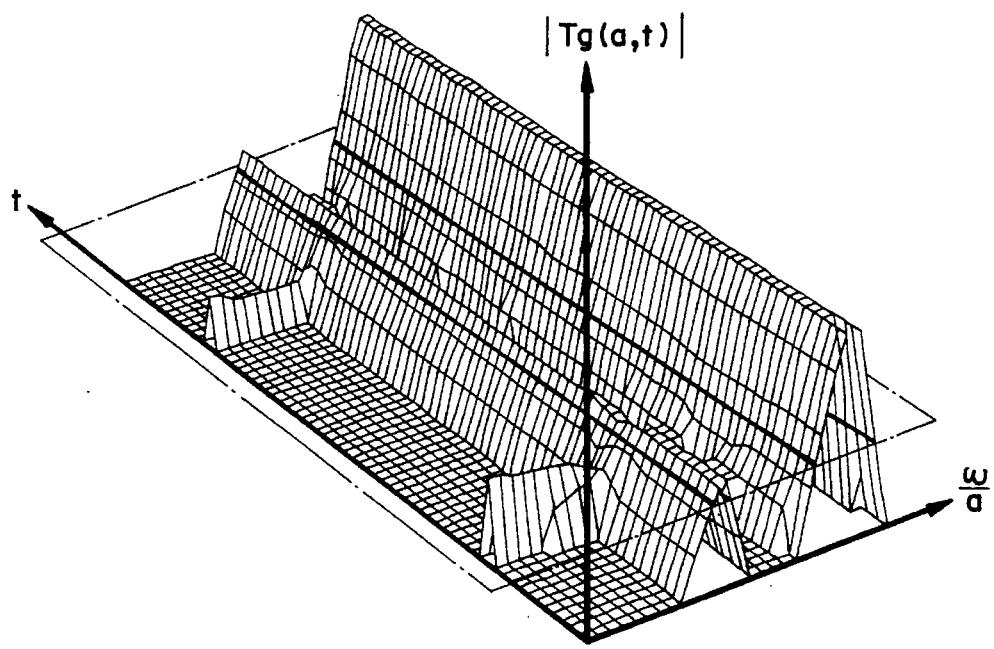
FIG. 20 is a graph showing wavelet coefficient strength.

Further, FIG. 20 shows the manner in which the analytical result is cut by a plane passing through a certain threshold-value strength T(T$_g$) and lying parallel to a plane comprising the t axis and ω/a axis in a graph of the aforesaid wavelet coefficient strength.

Figure 21:
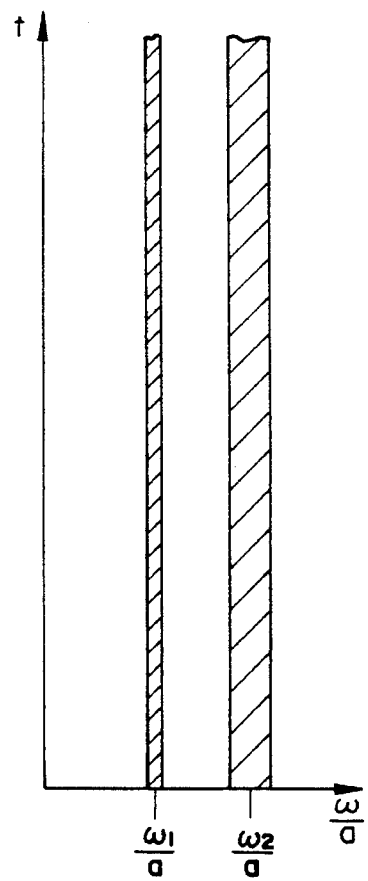
FIG. 21 is a graph showing threshold-value cross section of wavelet coefficient strength.

FIG. 21 illustrates a cross section of wavelet coefficient strength that appears owing to this cut. Strength cross sections appear at the frequency positions ω$_1$/a, ω$_2$/a and it can be understood that the signal S$_1$ contains the frequencies ω$_1$ and ω$_2$.

The results of post-processing shown in FIGS. 17, 19 and 21 also are displayed on the display unit 17 or outputted by the output unit 18.

The post-processor 14 that applies the post-processing to these results of wavelet analysis preferably is realized by a computer system. By post-processing of the results of wavelet analysis, graphs that are very easy to read are obtained and detailed information relating to the input signal may be acquired from the graphs.

Figure 22:
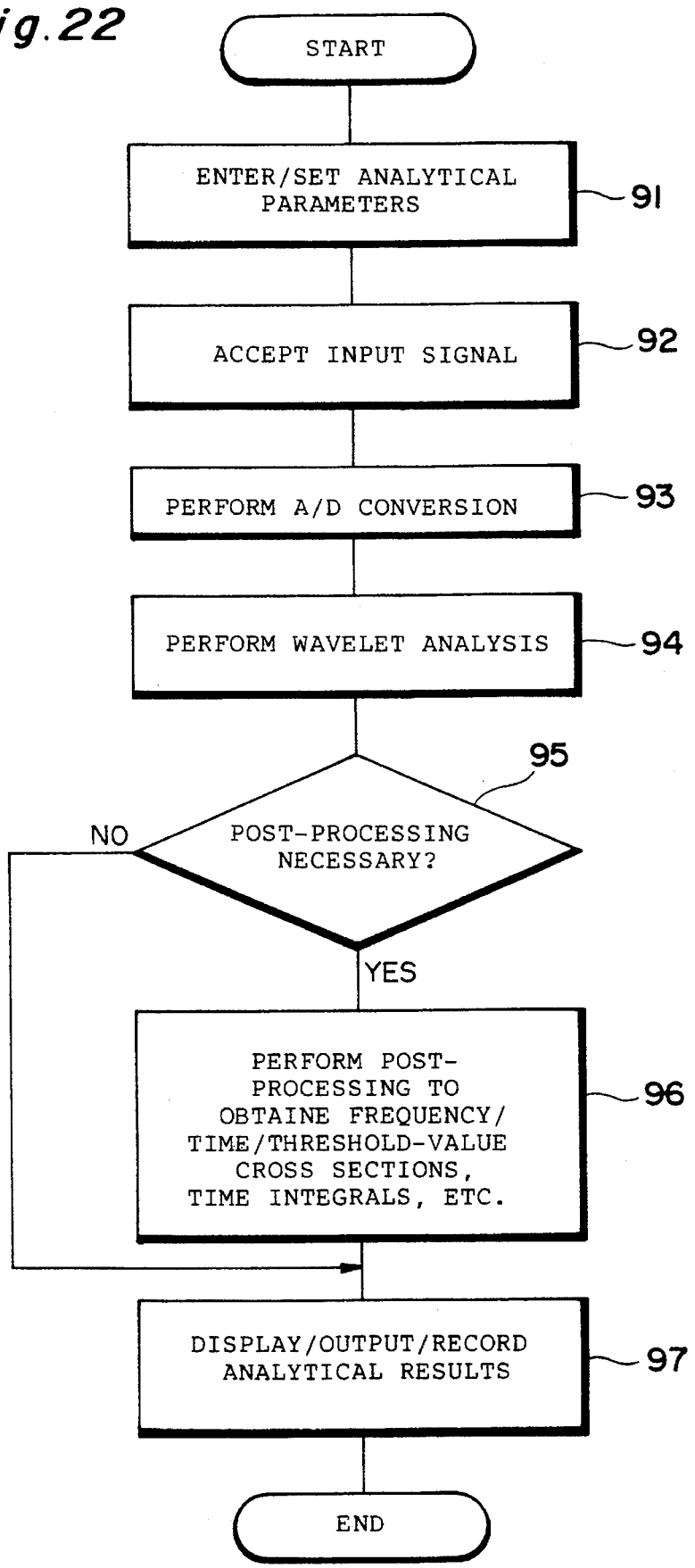
FIG. 22 is a flowchart showing the overall processing procedure in a signal analyzing system.

FIG. 22 systematically illustrates the overall operation of the signal analyzing system (see FIG. 1) based upon the wavelet transformation described above in detail. The wavelet transformation unit can be implemented by a circuit having a special-purpose hardware architecture, as set forth above, or by a computer system programmed so as to execute the wavelet transform. The post-processor 14 can be implemented preferably by a computer system, and the analytical-parameter input/setting unit 16 can be realized by the input unit of the computer system. Accordingly, it is possible to implement the wavelet transformation unit 13, the post-processor 14, the storage unit 15, the analytical-parameter input/setting unit 16, the display unit 17 and the output unit 18 by a general computer system having an input/output unit and a storage device.

First, various parameters for the wavelet transformation processing are entered from the analytical-parameter input/setting unit 16 (step 91).

Next, the input signal S(t) is applied via the input unit 11 (step 92), and the input signal is converted into the digital input data S(k) by the A/D converter 12. In general, the input data is stored temporarily in the storage unit 15. The input data is then read out of the storage unit 15 in sequential fashion, wavelet transformation is executed by the wavelet transformation unit 13 in accordance with the above-described procedure, and the wavelet coefficient T$_g$ is obtained (step 94). The wavelet coefficient T$_g$ is stored in the storage unit 15. The input data S(k) resulting from the A/D conversion may be applied directly to the wavelet transformation unit 13.

After the wavelet transformation processing in the wavelet transformation unit 13, it is determined whether post-processing is necessary (step 95). The user of the system is capable of entering, from the input unit 16, whether or not post-processing is necessary.

If post-processing is required, the post-processing relating to the above-described frequency cross section, time cross section and threshold-value cross section, etc., is performed (step 96), the results of post-processing such as illustrated in FIGS. 13, 15, 17, 19, 21 are displayed on the display unit 17 and these results are outputted from the output unit 18 (step 97). If post-processing is unnecessary, the wavelet coefficients obtained by the wavelet transform are displayed on the display unit 17, or are outputted from the output unit 18, in, say, the form illustrated in FIGS. 12, 14, 16, 18 and 20, or in some other form (e.g., as an array of numerical values) (step 97).

(7) Applications of Signal Analyzing System

As mentioned earlier, the signal analyzing system for wavelet transformation may be applied over a wide range, such as in non-destructive testing, fish finding and measurement of blood flow using ultrasonic waves, radar utilizing electromagnetic waves, clarification of internal structure underground using seismic waves, speech analysis, speech recognition, analysis of electrocardiogram waveforms and examination of brain waves.

Such application can be divided broadly into two types.

The first type involves transmitting a physical signal of some kind toward an object, receiving the signal reflected from the object and analyzing the reflected signal received. The physical signal transmitted may be an ultrasonic wave, an electromagnetic wave or a seismic wave, etc. The frequency components, times of occurrence, etc., of these signals often are known in advance or are capable of being measured. In this type of application, the system configuration shown in FIG. 1 additionally requires a source for generating the physical signal.

The second type of application involves receiving a physical signal generated by an object and analyzing the signal received. The system configuration illustrated in FIG. 1 is capable of being utilized as is. Speech analysis, speech recognition, analysis of electrocardiogram waveforms and examination of brain waves fall within this type of application.

Image analysis is a special form of application. In this application, input data to be analyzed is given in advance. Accordingly, the input unit 11 in the system configuration of FIG. 1 is unnecessary. Of course, since image data is obtained by photographing a subject using a camera having an internal solid-state electronic image pick-up device, such as a CCD, and subjecting the video signal obtained to an A/D conversion, a camera can be considered to correspond to the input unit 11. This means that image analysis can be classified as being of the second type mentioned above.

Figure 23:
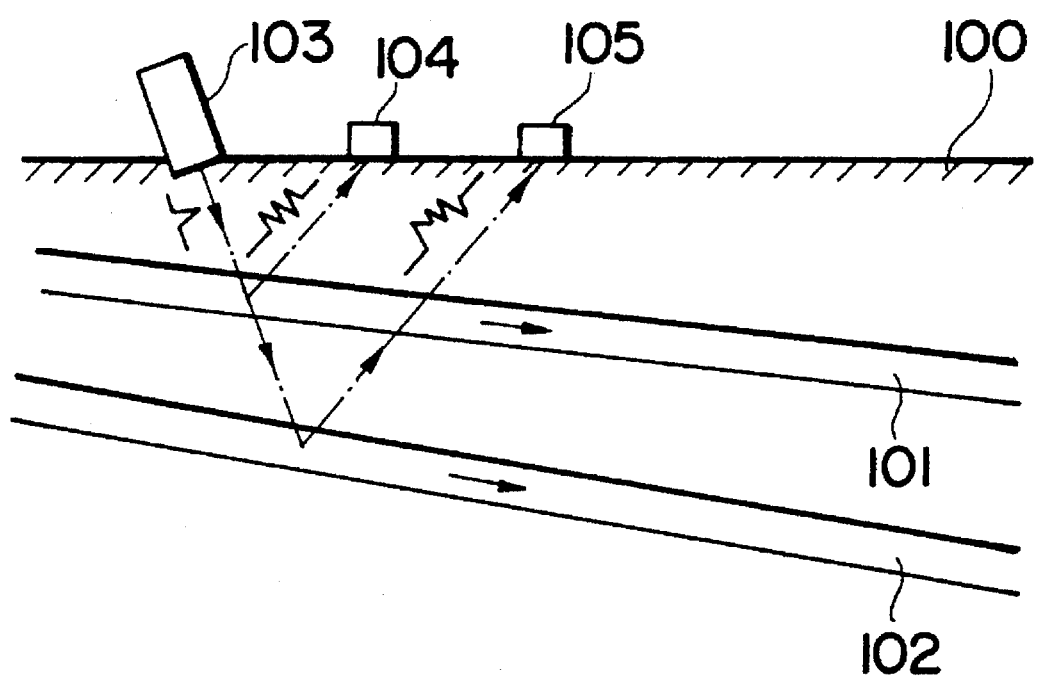
FIG. 23 is a structural view showing application to measurement of blood flow.
Figure 24A:
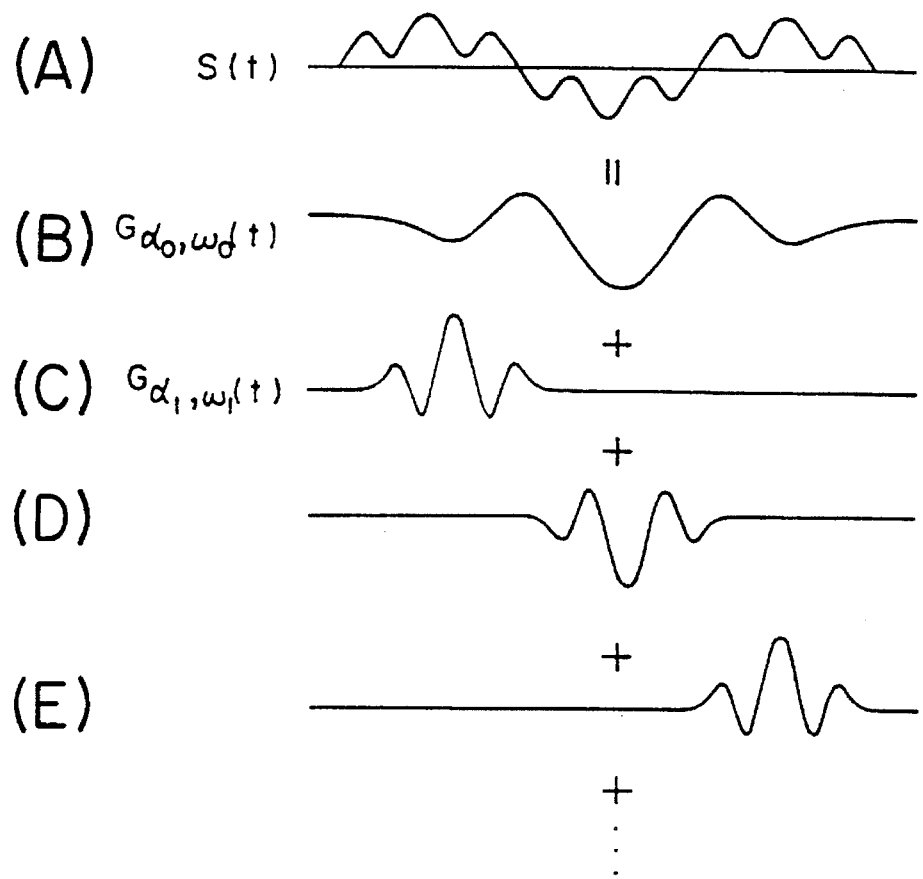
FIGS. 24a and 24b are waveform diagrams showing Fourier analysis and wavelet analysis, respectively.
Figure 24B:
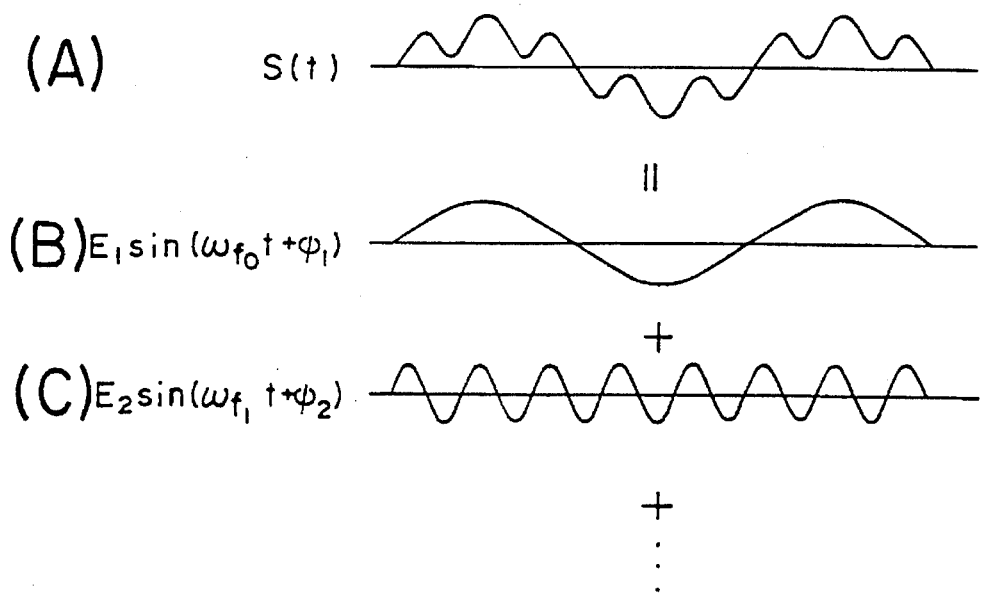

FIG. 23 illustrates application to measurement of blood flow.

Blood vessels 101, 102 are present in living tissue 100, and blood is flowing through the blood vessels 101, 102. An ultrasonic transmitter 103 and ultrasonic receives 104, 105 are placed upon the surface of the living tissue 100.

Ultrasonic waves having a single frequency determined in advance are transmitted from the ultrasonic transmitter 103 in a very short period of time. The ultrasonic pulses propagate through the interior of the living tissue 100 and are reflected by the blood vessels 101, 102 or by the blood flowing through them. The reflected waves are received by the ultrasonic receivers 104, 105. The ultrasonic receivers 104, 105 correspond to the input unit 11 shown in FIG. 1, and the ultrasonic reception signals are subjected to wavelet analysis upon being subjected to an A/D conversion. Though the two ultrasonic receivers 104, 105 are illustrated, it goes without saying that only one will suffice.

When the ultrasonic waves transmitted from the transmitter 103 are reflected by blood within the blood vessels 101, 102, the frequency of the ultrasonic waves is shifted in conformity with flow velocity of the blood owing to the Doppler effect. Accordingly, the frequency components contained in the reflected ultrasonic waves are detected in the wavelet analysis of the received ultrasonic waves, and the detected frequency components are compared with the frequency of the transmitted ultrasonic waves, thereby making it possible to determine the flow velocity of the blood flow. Since the positions at which the ultrasonic waves have been reflected also can be determined in the wavelet analysis, the positions of the blood vessels 101, 102 in the living tissue 100 can be detected.

What is claimed is:

1. A high-speed processing apparatus comprising processing circuit means in a plurality of stages, the processing circuit means of each stage including:

a plurality of cascade-connected shift register means for storing input data and successively shifting the input data in response to applied clock pulses;

a plurality of first storage circuit means for storing function values sampled at a prescribed sampling period with regard to a base function having such a property that a convolution of identical functions becomes the same as the original function;

a plurality of second storage circuit means for storing function values, sampled at the prescribed sampling period, with regard to a low-pass filter function for converting a frequency of a frequency component possessed by the input data into input data, for the next stage, having a frequency component whose frequency is 1/M of the frequency of the first-mentioned input data, where M represents a positive integer excluding the integer 1;

a plurality of first multiplying circuit means each for multiplying input data or output data of said shift register means by corresponding function value stored in said first storage circuit means;

first adding circuit means for adding together output data from these first multiplying circuit means;

a plurality of second multiplying circuit means each for multiplying input data or output data of said shift register means by corresponding function value stored in said second storage circuit means; and second adding circuit means for adding together output data from these second multiplying circuit means;

multiplication and addition in said processing circuit means of each stage being performed during one period of the clock pulses;

the shift register means in the processing circuit means of a succeeding stage being provided in a number which is M times that of the shift register means in the processing circuit means of a preceding stage, and data having a sampling period which is M times that of the input data or output data of these shift register means is applied to said first and second multiplying circuit means;

output data from said second adding circuit means being applied as input data to the processing circuit means of the next stage.

2. A high-speed processing apparatus according to claim 1, wherein the processing circuit means of a final stage lacks said second storage circuit means, said second multiplying circuit means and said second adding circuit means.

3. A high-speed processing apparatus comprising:

processing circuit means for performing a repetitive convolution processing operation over a plurality of stages;

memory means for storing, stage by stage, input data applied to said processing circuit means; and control circuit means for controlling writing of data to and reading of data from said memory means as well as repetition of the processing operation performed by said processing circuit means;

said processing circuit means including:

a plurality of first storage circuit means for storing function values sampled at a prescribed sampling period with regard to a base function having such a property that a convolution of identical functions becomes the same as the original function;

a plurality of second storage circuit means for storing function values sampled at the prescribed sampling period with regard to a low-pass filter function for converting a frequency of a frequency component possessed by the input data into input data, for the next stage, having a frequency component whose frequency is 1/M of the frequency of the first-mentioned input data, where M represents a positive integer excluding the integer 1;

a plurality of first multiplying circuit means which, in the processing operation of each stage, are for multiplying input data of the stage stored in said memory means by corresponding function values stored in said first storage circuit means;

first adding circuit means which, in the processing operation of each stage, are for adding together output data from said first multiplying circuit means;

a plurality of second multiplying circuit means which, in the processing operation of each stage, are for multiplying input data of the stage stored in said memory means by corresponding function values stored in said second storage circuit means; and second adding circuit means which, in the processing operation of each stage, are for adding together output data from said second multiplying circuit means;

the number of items of input data of each stage stored in said memory means being twice the number of items of input data of the preceding stage; when input data for a processing operation of a succeeding stage is obtained from said second adding circuit means in the processing operation of each stage, this obtained input data being stored in said memory means as input data of said succeeding stage and the input data of said succeeding stage that has been stored in said memory means being successively shifted;

said control circuit means reading the input data for the processing operation of each stage out of said memory means at a fixed period in such a manner that a readout sampling period of the input data of the succeeding stage becomes M times the readout sampling period of the preceding stage, applying this input data to said processing circuit means and applying data obtained from said second adding circuit means of said processing circuit means to said memory means as the input data of the next stage.

4. A high-speed processing apparatus according to claim 3, wherein whenever repetition of said processing operation over a plurality of stages ends, said control circuit means accepts input data for an initial stage, applies this input data to said processing circuit means, stores the input data in said memory means as input data of the initial stage and neglects input data, for the next stage, obtained in a processing operation of a final stage.

5. A high-speed processing apparatus comprising:

processing circuit means for repeatedly performing a convolution operation;

memory means for storing input data for a processing operation of a succeeding stage to be applied to said processing circuit means; and control circuit means for controlling writing of data to and reading of data from said memory means as well as repetition of the processing operation performed by said processing circuit means;

said processing circuit means including:
- a plurality of first storage circuit means for storing function values sampled at a prescribed sampling period with regard to a base function having such a property that a convolution of identical functions becomes the same as the original function;
- a plurality of second storage circuit means for storing function values sampled at the prescribed sampling period with regard to a low-pass filter function for converting a frequency of a frequency component possessed by the input data into input data, for the next stage, having a frequency component whose frequency is 1/M of the frequency of the first-mentioned input data, where M represents a positive integer excluding the integer 1;
- a plurality of first multiplying circuit means which, in the processing operation of each stage, are for multiplying input data read out of said memory means by corresponding function values stored in said first storage circuit means;
- first adding circuit means which, in the processing operation of each stage, are for adding together output data from said first multiplying circuit means;
- a plurality of second multiplying circuit means which, in the processing operation of each stage, are for multiplying input data read out of said memory means by corresponding function values stored in said second storage circuit means; and
- second adding circuit means which, in the processing operation of each stage, are for adding together output data from said second multiplying circuit means;

said control means performing an operation of reading input data for a processing operation of an initial stage, in which the number of items of input data is equal to the number of function values stored in said first and second storage means, out of said memory means and applying this input data to said processing circuit means, said operation being performed repeatedly with regard to all input data for the processing operation of the initial stage while the input data to be applied is successively shifted, and successively storing, in said memory means, input data for the next stage obtained from said second adding circuit means for every processing operation in said processing circuit means;

in processing operations of stages following the processing operation of the initial stage, said control circuit means reading, in every stage, input data, the number of items of which is equal to the number of function values, out of said memory means and applying this input data to said processing circuit means, while successively shifting the input data to be read out, at a readout sampling period which is M times the readout sampling period of the input data from said memory means in the processing operation of the preceding stage, and successively storing the input data for the next stage obtained from said second adding circuit means in said memory means for every processing operation in said processing circuit means; and in a processing operation of a final stage, said control circuit means performing solely an operation of reading the input data out of said memory means and applying this input data to said processing circuit means.

6. A high-speed processing apparatus comprising:
processing circuit means of a plurality of stages for executing a convolution of input data and function data of a base function having such a property that a convolution of identical functions becomes the same as the original function; and low-pass filtering circuit means of a number of stages one less than that of said processing circuit means for converting a frequency component possessed by the input data of a preceding stage into input data, for the next stage, having a frequency component which is 1/M of the first-mentioned frequency component, where M represents a positive integer excluding the integer 1;

the function data in said processing circuit means of each stage being extended over a range M times that of function data in the processing circuit means of a preceding stage;

said processing circuit means and low-pass filtering circuit means of each stage respectively executing convolution and low-pass filtering operations at a sampling period whose period is M times that of the sampling period in the processing circuit means and low-pass filtering circuit means of the preceding stage;

input data for the processing circuit means of an initial stage being applied to the low-pass filtering circuit means of the initial stage and input data obtained from each low-pass filtering circuit means being applied to the processing circuit means of the next stage and the low-pass filtering circuit means of the next stage.

7. A high-speed processing method comprising the steps of:

using processing circuit means of a plurality of stages for executing a convolution of input data and function data of a base function having such a property that a convolution of identical functions becomes the same as the original function, and low-pass filtering circuit means of a number of stages one less than that of said processing circuit means for converting a frequency component possessed by the input data of a preceding stage into input data, for the next stage, having a frequency component which is 1/M of the first-mentioned frequency component, where M represents a positive integer excluding the integer 1;

setting function data, which is extended over a range M times that of function data set in the processing circuit means of a preceding stage, in said processing circuit means of each stage;

causing said processing circuit means and low-pass filtering circuit means of each stage to respectively execute convolution and low-pass filtering operations at a sampling period whose period is M times that of the sampling period in the processing circuit means and low-pass filtering circuit means of the preceding stage; and applying input data for the processing circuit means of an initial stage to the low-pass filtering circuit means of the initial stage, and applying input data obtained from each low-pass filtering circuit means to the processing circuit means of the next stage and the low-pass filtering circuit means of the next stage.

8. A high-speed processing method comprising the steps of:

using processing means, which has been set beforehand to function data of a base function having such a property that a convolution of identical functions becomes the same as the original function, for executing a convolution of input data and this function data, low-pass filtering means for converting a frequency component possessed by the input data into input data, for the next stage, having a frequency component which is 1/M of the first-mentioned frequency component, where M represents a positive integer excluding the integer 1, and storage means for storing, stage by stage, the input data to be used by said processing means;

storing input data in said storage means in such a manner that the number of items of data of each stage becomes M times the number of items of input data of the preceding stage, and, when the input data for the initial stage has been applied, and when the input data for the next stage has been obtained from said low-pass sampling means in the processing operation of each stage, storing the items of input data in said storage means as input data of the corresponding stage, and successively shifting the input data of the corresponding stage stored in said storage means;

when the input data for the initial stage has been applied, reading the input data for the initial stage out of said storage means and applying this input data to said processing means and said low-pass filtering means, adopting the data obtained from said processing means as output data of the initial stage, and storing the data obtained from said low-pass filtering means in said storage means as input data for the next stage;

in stages from the next stage onward, reading the input data for the processing operation of each stage out of said storage means and applying this input data to said processing means and said low-pass filtering means at a fixed period in such a manner that the readout sampling period of the input data of the succeeding stage becomes M times the readout sampling period of the preceding stage, adopting the data obtained from said processing means as the output data of each stage and applying the data obtained from said low-pass filtering means to said storage means as input data of the next stage;

Repeating the above-described operation over a prescribed number of stages and disabling said low-pass filtering means in a final stage; and whenever repetition of the above-described operation over the prescribed number of stages ends, accepting input data for the initial stage and starting the above-described repetitive operation again.

9. A high-speed processing method comprising the steps of:

using processing means, which has been set beforehand to function data of a base function having such a property that a convolution of identical functions becomes the same as the original function, for executing a convolution of input data and this function data, low-pass filtering means for converting a frequency component possessed by the input data into input data, for the next stage, having a frequency component which is 1/M of the first-mentioned frequency component, where M represents a positive integer excluding the integer 1, and storage means for storing the input data to be used by said processing means;

performing an operation of reading input data for a processing operation of an initial stage, in which the number of items of input data is equal to the number of function values that have been set in said processing means, out of said storage means and applying this input data to said processing means and said low-pass filtering means, said operation being performed repeatedly with regard to all input data for the processing operation of the initial stage while successively shifting the input data to be applied, adopting the data obtained from said processing means as output data of the initial stage and successively storing, in said storage means, the output data as input data for the next stage obtained from said low-pass filtering means;

in processing operations of stages following the processing operation of the initial stage, reading, in every stage, input data, the number of items of which is equal to the number of function values, out of said storage means and applying this input data to said processing means and said low-pass filtering means, while successively shifting the input data to be read out, at a readout sampling period which is M times the readout sampling period of the input data from said storage means in the processing operation of the preceding stage, adopting the data obtained from said processing means as output data of each stage and successively storing the output data as input data for the next stage obtained from each low-pass filtering means in said storage means; and performing the above-described operation over a prescribed plurality of stages and, in a processing operation of a final stage, performing solely an operation of reading input data out of said memory means and applying this input data to said processing means.

10. A signal analyzing system comprising:

an input circuit for converting a given physical signal to an electric input signal;

an A/D converting circuit for converting an input signal outputted by said input circuit into digital input data; and an analytical processing apparatus for analyzing the digital input data outputted by said A/D converting circuit;

said analytical processing apparatus including:
processing means of a plurality of stages for executing a convolution of input data and function data of a base function having such a property that a convolution of identical functions becomes the same as the original function; and low-pass filtering means of a number of stages one less than that of said processing means for converting a frequency component possessed by the input data of a preceding stage into input data, for the next stage, having a frequency component which is 1/M of the first-mentioned frequency component, where M represents a positive integer excluding the integer 1;

the function data in said processing circuit means of each stage being extended over a range M times that of function data in the processing means of a preceding stage;

said processing means and low-pass filtering means of each stage respectively executing convolution and low-pass filtering operations at a sampling period in the processing means and low-pass filtering means of the preceding stage;

input data for the processing means of an initial stage being applied to the low-pass filtering means of the initial stage and input data obtained from each low-pass filtering means being applied to the processing means of the next stage and the low-pass filtering means of the next stage.

11. A signal analyzing system according to claim 10, wherein said processing means and said low-pass filtering means of said plurality of stages are implemented by repeatedly operating a single processing means and a single low-pass filtering means.

12. A signal analyzing system according to claim 10, further comprising a storage device for storing the input data obtained from said A/D converting circuit and data indicative of analytical results obtained from said processing means.

13. A signal analyzing system according to claim 12, further comprising a post-processor for converting the data indicative of the analytical results obtained from said processing means into data suitable for display.

14. A signal analyzing system according to claim 10, further comprising an output unit for outputting, as visible information, the data indicative of the analytical results obtained from said processing means, the data indicative of the analytical results stored in said storage device or post-processed data obtained from the post-processor.

15. A measuring system comprising:
   transmitting means for transmitting a physical signal toward an object;
   receiving means for receiving the physical signal that returns upon being reflected from the object and converting the physical signal into an electric input signal;
   an A/D converting circuit for converting the input signal outputted by said receiving means into digital input data; and
   an analytical processing apparatus for analyzing the digital input data outputted by said A/D converting circuit;
   said analytical processing apparatus including:
      processing means of a plurality of stages for executing a convolution of input data and function data of a base function having such a property that a convolution of identical functions becomes the same as the original function; and
      low-pass filtering means of a number of stages one less than that of said processing means for converting a frequency component possessed by the input data of a preceding stage into input data, for the next stage, having a frequency component which is 1/M of the first-mentioned frequency component, where M represents a positive integer excluding the integer 1;
      the function data in said processing circuit means of each stage being extended over a range M times that of function data in the processing means of a preceding stage;
      said processing means and low-pass filtering means of each stage respectively executing convolution and low-pass filtering operations at a sampling period whose period is M times that of the sampling period in the processing means and low-pass filtering means of the preceding stage;
      input data for the processing means of an initial stage being applied to the low-pass filtering means of the initial stage and input data obtained from each low-pass filtering means being applied to the processing means of the next stage and the low-pass filtering means of the next stage.

16. A measuring method comprising the steps of:
   transmitting a physical signal toward an object;
   receiving the physical signal that returns upon being reflected from the object and converting the signal into an electric input signal;
   converting the converted electric input signal into digital input data; and
   subjecting the converted input data to wavelet analysis;
   said wavelet analysis including steps of:
      using processing means of a plurality of stages for executing a convolution of input data and function data of a base function having such a property that a convolution of identical functions becomes the same as the original function, and low-pass filtering means of a number of stages one less than that of said processing means for converting a frequency component possessed by the input data of a preceding stage into input data, for the next stage, having a frequency component which is 1/M of the first-mentioned frequency component, where M represents a positive integer excluding the integer 1;
      setting function data, which is extended over a range M times that of function data set in the processing means of a preceding stage, in said processing means of each stage;
      causing said processing means and low-pass filtering means of each stage to respectively execute convolution and low-pass filtering operations at a sampling period whose period is M times that of the sampling period in the processing means and low-pass filtering means of the preceding stage;
      applying input data for the processing means of an initial stage to the low-pass filtering means of the initial stage and applying input data obtained from each low-pass filtering means to the processing means of the next stage and the low-pass filtering means of the next stage; and
      obtaining data indicative of results of wavelet analysis from said processing means.

* * * * *